United States Patent
Koketsu et al.

(10) Patent No.: US 12,253,567 B2
(45) Date of Patent: Mar. 18, 2025

(54) CAPACITY DEGRADATION PREDICTION METHOD AND PREDICTION SYSTEM

(71) Applicant: HONDA MOTOR CO., LTD., Tokyo (JP)

(72) Inventors: Seiichi Koketsu, Wako (JP); Shunsuke Konishi, Wako (JP); Hodaka Tsuge, Wako (JP); Hidetoshi Utsumi, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 557 days.

(21) Appl. No.: 17/670,647

(22) Filed: Feb. 14, 2022

(65) Prior Publication Data

US 2022/0308115 A1  Sep. 29, 2022

(30) Foreign Application Priority Data

Mar. 24, 2021  (JP) ................. 2021-049343

(51) Int. Cl.
  *G01R 31/387* (2019.01)
  *G01R 31/3835* (2019.01)
  *G01R 31/392* (2019.01)

(52) U.S. Cl.
  CPC ....... *G01R 31/387* (2019.01); *G01R 31/3835* (2019.01); *G01R 31/392* (2019.01)

(58) Field of Classification Search
  USPC .......................................... 320/132
  See application file for complete search history.

(56) References Cited

U.S. PATENT DOCUMENTS

2018/0316204 A1* 11/2018 Basu .................. H02J 7/005
2021/0001129 A1*  1/2021 Pei ................... A61N 1/3708

FOREIGN PATENT DOCUMENTS

| JP | 2010-032412 A | 2/2010 |
| JP | 2011-208966 A | 10/2011 |
| JP | 2015-087344 A | 5/2015 |

OTHER PUBLICATIONS

Office Action dated Oct. 25, 2022 issued over the corresponding Japanese Patent Application No. 2021-049343 with the machine translation thereof.

* cited by examiner

*Primary Examiner* — Bryce M Aisaka
(74) *Attorney, Agent, or Firm* — Carrier, Shende and Associates P.C.; Joseph P. Carrier; Jeffrey T. Gedeon

(57) ABSTRACT

A prediction system includes a charger and an estimation apparatus, and performs a method of predicting capacity degradation of a secondary battery. The estimation apparatus obtains changes of a plurality of parameters of capacity degradation, based on a fitting operation of fitting, to a target-battery charge curve of a target battery, reference data of the target battery or a battery of the same type as the target battery. Further, the estimation apparatus identifies a degradation change point where the degradation speed of the maximum battery capacity becomes high as a result of increase of the usage degree of the target battery, based on the plurality of obtained parameters.

8 Claims, 14 Drawing Sheets

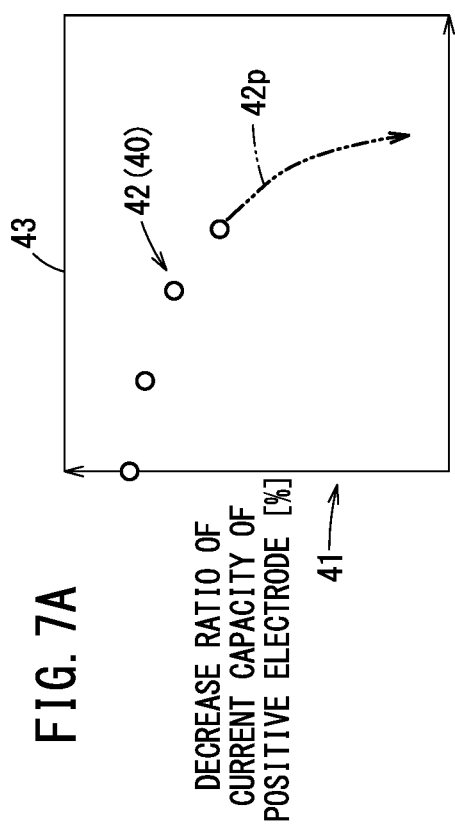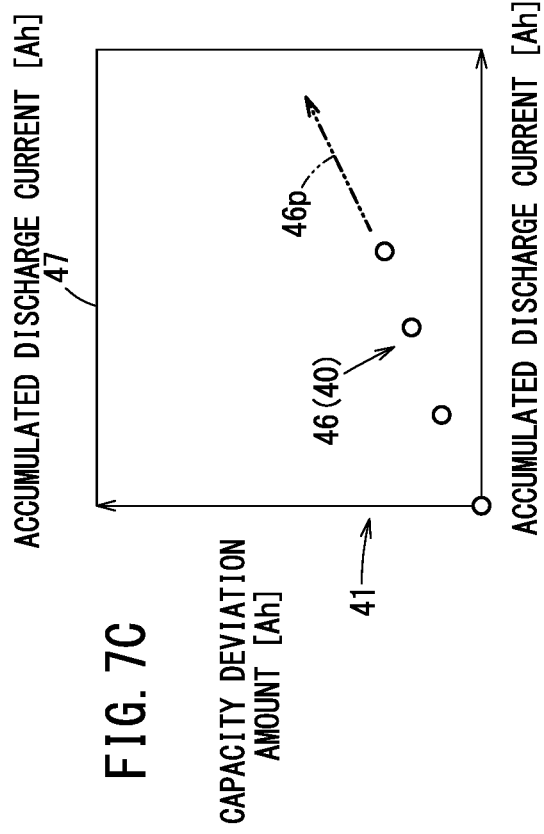
FIG. 7A
FIG. 7B
FIG. 7C
FIG. 7D

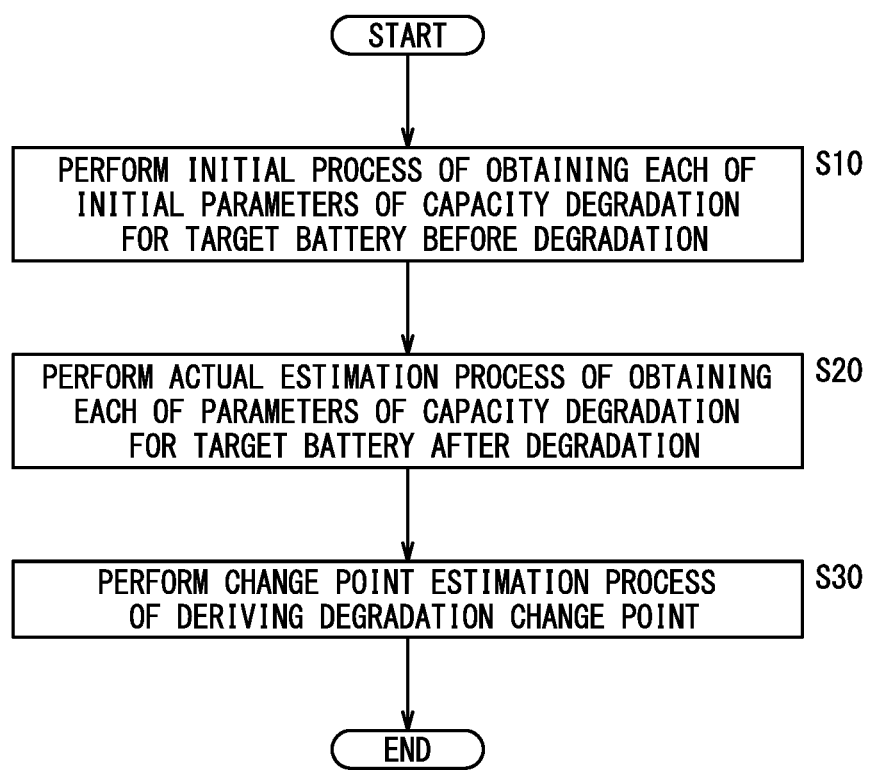

CAPACITY DEGRADATION PREDICTION METHOD AND PREDICTION SYSTEM

CROSS-REFERENCE TO RELATED APPLICATIONS

This application is based upon and claims the benefit of priority from Japanese Patent Application No. 2021-049343 filed on Mar. 24, 2021, the contents of which are incorporated herein by reference.

BACKGROUND OF THE INVENTION

Field of the Invention

The present invention relates to a capacity degradation prediction method of estimating capacity degradation of a secondary battery, and a prediction system.

Description of the Related Art

By changing use application of a secondary battery in accordance with the condition of capacity degradation thereof, it is possible to use the secondary battery for a longer time. For example, this includes switching use application of the secondary battery from for a moving body to for use in a stationary application.

As a method of capacity degradation prediction method of secondary batteries, JP 2015-087344 A discloses a half cell fitting method of estimating capacity degradation of a secondary battery, based on electromotive force curves of a positive electrode and a negative electrode of the secondary battery. In the method, the capacity degradation is estimated based on changes of fitting parameters obtained when the position and the shape in the capacity direction of one of the electromotive force curve of a new battery and the electromotive force curve of a degraded battery are changed and the one electromotive force curve is fitted to the other electromotive force curve.

SUMMARY OF THE INVENTION

The secondary battery is subjected to a degradation in which the maximum battery capacity is decreased due to repeated charging/discharging. Such a degradation has a degradation change point (secondary degradation point) where the progress rate of degradation becomes large as a result of increase in the usage degree (e.g., accumulated discharge current). In the capacity degradation prediction method, if the degradation change point can be estimated, it is possible to more effectively plan for the effective use of the secondary battery and more appropriately decide when to replace the secondary battery.

The present invention has been made taking the above circumstances into account, and an object of the present invention is to provide a capacity degradation prediction method and a prediction system in which it is possible to accurately estimate the degradation change point where the degradation speed of the maximum battery capacity of the secondary battery becomes high.

In order to achieve the above object, according to a first aspect of the present invention, a capacity degradation prediction method of predicting capacity degradation of a secondary battery is provided. The method includes: performing an actual estimation process of obtaining a target-battery charge curve, represented by a current capacity and a voltage, of a target battery as a target of estimation of capacity degradation, and obtaining changes of a plurality of parameters concerning capacity degradation, based on fitting operation of fitting, to the obtained target-battery charge curve, reference data of the target battery or a battery of the same type as the target battery, and performing a change point estimation process of identifying a degradation change point where a degradation speed of a maximum battery capacity becomes high as a result of increase of a usage degree of the target battery, based on the obtained plurality of parameters.

Further, in order to achieve the above object, according to a second aspect of the present invention, a prediction system configured to perform a method of predicting capacity degradation of a secondary battery is provided. The prediction system includes a charger configured to charge a target battery which is a target of estimation of the capacity degradation, and an estimation apparatus connected to the charger. The estimation apparatus is configured to perform an actual estimation process of obtaining a target-battery charge curve, based on charge current and charge voltage supplied to the target battery after degradation, the target-battery charge curve being represented by a current capacity and a voltage, and obtaining changes of a plurality of parameters concerning capacity degradation, based on fitting operation of fitting, to the obtained target-battery charge curve, reference data of the target battery or a battery of the same type as the target battery, and perform a change point estimation process of identifying a degradation change point where a degradation speed of a maximum battery capacity becomes high as a result of increase of a usage degree of the target battery, based on the obtained plurality of parameters.

In the capacity degradation prediction method and the prediction system as described above, it is possible to accurately estimate the degradation change point where the degradation speed of the maximum battery capacity of the secondary battery becomes high.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 7A is a graph showing a usage degree-positive electrode capacity curve, FIG. 7B is a graph showing a usage degree-negative electrode capacity curve, FIG. 7C is a graph showing a usage degree-capacity deviation curve, and FIG. 7D is a graph showing a usage degree-offset amount curve;

FIG. 12 is a flow chart showing a process of the capacity degradation prediction method;

DESCRIPTION OF THE INVENTION

Hereinafter, a preferred embodiment of the present invention will be described in detail with reference to the accompanying drawings.

Figure 1:
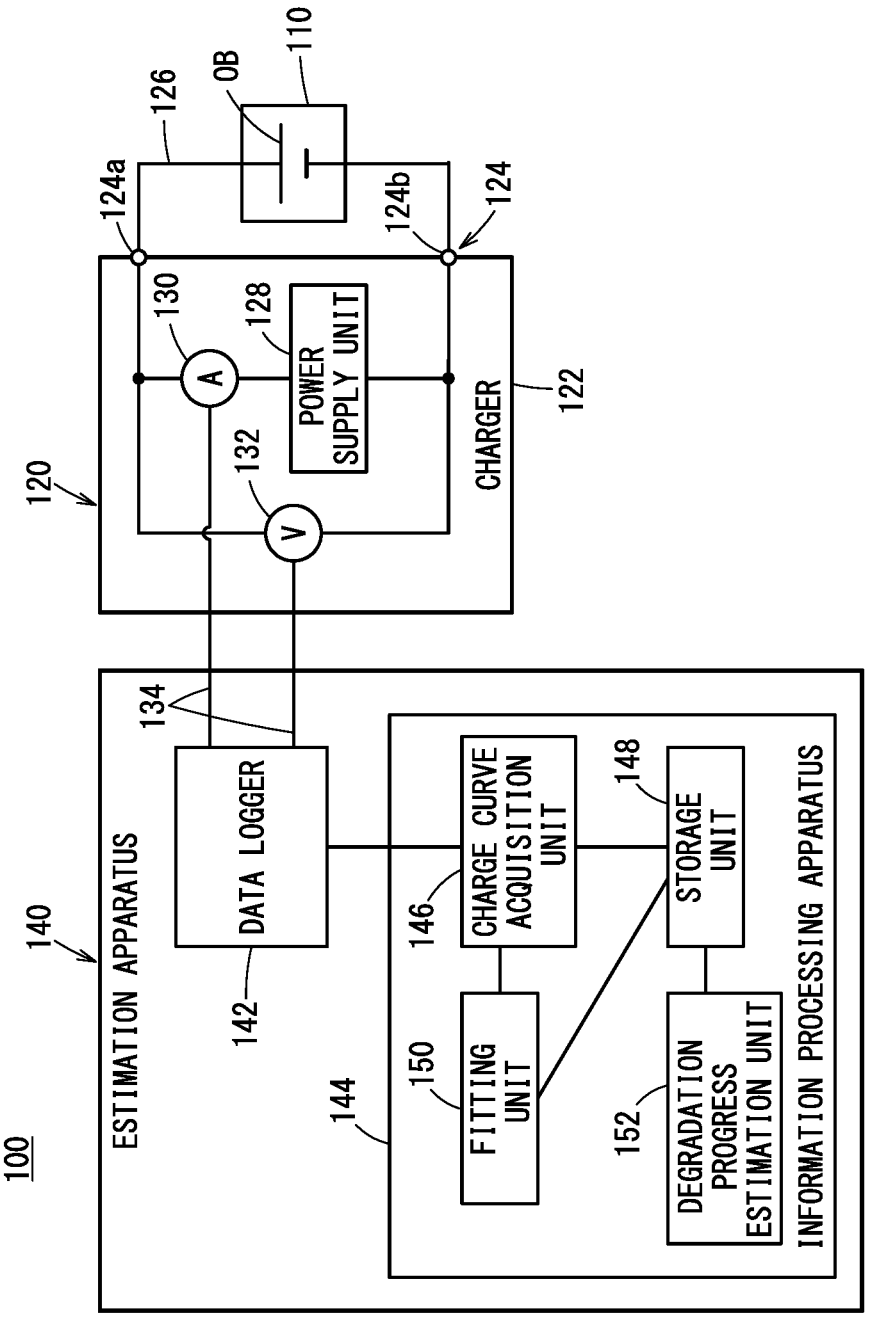
FIG. 1 is a diagram showing a prediction system for carrying out a method of predicting capacity degradation according to an embodiment of the present invention.

In a method of predicting capacity degradation according to an embodiment of the present invention, as shown in FIG. 1, capacity degradation of a battery to be measured (hereinafter referred to as a target battery OB), which is a measurement object, is estimated using a prediction system 100. The prediction system 100 includes a placement unit 110, a charger 120, and an estimation apparatus 140. The target battery OB is set on the placement unit 110. The charger 120 performs charging of the target battery OB set on the placement unit 110. The estimation apparatus 140 is communicably connected to the charger 120, and is configured to actually estimate the capacity degradation of the target battery OB.

The target battery OB is a rechargeable secondary battery having a positive electrode and a negative electrode for outputting suitable electrical power (current and voltage). Charging of the target battery OB can be performed through the positive electrode and the negative electrode. The type of secondary battery is not limited, and can include lithium ion secondary batteries, lithium ion polymer secondary batteries, lead acid batteries, or nickel based batteries, etc. In this embodiment, a case where a lithium ion secondary battery is used as the target battery OB is illustrated. The number of target batteries OB measured by the prediction system 100 is not limited to one. A plurality of target batteries OB may be measured by the prediction system 100.

Further, the target battery OB includes components such as a current detection unit (not shown) for detecting discharge current, charge current, etc., a memory (not shown) storing the detected discharge current, the detected charge current, etc., a processor, and a communication unit (not shown). The processor calculates information about a usage degree of the target battery OB, and outputs the information about the calculated usage degree to the outside through the communication unit. The information about the usage degree is an indicator indicative of the usage conditions of the secondary battery. For example, such an indicator includes the accumulation amount (accumulated discharge current) of electrical current discharged from the secondary battery, the accumulation amount (accumulated charge current) of electrical current with which the secondary battery has been charged, and the number of times the secondary battery has been charged, or the period of time for which the secondary battery has been used. Hereinafter, a case where the accumulated discharge current is used as the information about the usage degree will be described.

The charger 120 includes a casing 122, and a pair of terminals 124 (a positive terminal 124a and a negative terminal 124b) provided on the casing 122. The pair of terminals 124 are electrically connected to the target battery OB set on the placement unit 110 through electrical wiring 126. In the casing 122 of the charger 120, a power supply unit 128 capable of outputting electric power to the pair of terminals 124, an ammeter 130 for detecting charge current supplied from the power supply unit 128 to the target battery OB, and a voltmeter 132 for detecting charge voltage supplied from the power supply unit 128 to the target battery OB are provided.

The power supply unit 128 outputs appropriate DC (direct-current) power (DC current, DC voltage) in correspondence with the state of the target battery OB. An energy storage type DC power supply capable of outputting DC power may be used as the power supply unit 128. Alternatively, the power supply unit 128 may have a structure where AC (alternating-current) power supplied from the outside of the charger 120 is converted into DC power. The ammeter 130 is connected in serial to the power supply unit 128. The ammeter 130 detects the charge current outputted from the power supply unit 128. The voltmeter 132 is connected in parallel to the power supply unit 128 and the ammeter 130. The voltmeter 132 detects the charge voltage (terminal voltage) of the target battery OB.

The estimation apparatus 140 includes a data logger 142 (memory device or storage device) connected to the charger 120 and an information processing apparatus 144 connected to the data logger 142. The data logger 142 is connected to the ammeter 130 and the voltmeter 132 of the charger 120 in a manner of enabling signal communications therebetween. The data logger 142 is a memory device or storage device which obtains and stores the charge current detected by the ammeter 130 and the charge voltage detected by the voltmeter 132. A known hard disk drive (HDD), a solid state drive (SSD), an off-line storage of any other type, or the like may be used as the data logger 142. The data logger 142 includes an input/output interface, a processor, a timer, etc. (not shown). The input/output interface is connected to the ammeter 130, the voltmeter 132, and the information processing apparatus 144 through communication lines 134 in a manner of enabling signal communications therebetween. The processor controls writing, reading, and deletion of the charge current and the charge voltage. It should be noted that the data logger 142 may be provided on the charger 120. Alternatively, the data logger 142 may receive the charge current and/or the charge voltage from the charger 120 through wireless communications.

The data logger 142 obtains charge current and charge voltage from the charger 120 periodically and continuously, while measuring the time by the timer. Then, the data logger associates the charge current and the charge voltage with the time, and stores them as data. This process is performed in the capacity degradation prediction method to create a charge curve (charge characteristics, QV curve) represented by the current capacity (mAh) and the charge voltage (V) of the target battery OB.

Further, the data logger 142 (or the information processing apparatus 144) is configured to be able to communicate with the target battery OB through a communication unit (not shown) connected to an input/output interface. The data logger 142 exchanges information with the target battery OB to obtain and store the accumulated discharge current of the target battery OB. The data logger 142 associates the charge current and the charge voltage of the target battery OB after degradation with the accumulated discharge current and stores them, thereby enabling the accumulated discharge current at the time when the target battery OB is charged by the charger 120, to be supplied to the information processing apparatus 144.

The information processing apparatus 144 includes at least one processor, a memory, an input/output interface, and an electronic circuit. Various types of drives (HDD, SSD, etc.) can be used as the memory, or the memory may include components associated with a processor or an integrated circuit. The at least one processor executes programs (not shown) stored in the memory, whereby a plurality of function blocks for performing information processing are formed in the information processing apparatus 144. It should be noted that at least some of the function blocks may include integrated circuits such as ASIC (Application Specific Integrated Circuit) and FPGA (Field Programmable Gate Array) and electronic circuits containing discrete elements.

Specifically, a charge curve acquisition unit 146, a storage unit (or memory unit) 148, a fitting unit 150, and a degradation progress estimation unit 152 are formed as the function blocks in the information processing apparatus 144. The charge curve acquisition unit 146 obtains the charge current, the charge voltage, the time, etc. accumulated in the data logger 142, and calculates the charge curve of the target battery OB (see FIG. 2). Hereinafter, the charge curve of the target battery OB will be referred to as a target-battery charge curve 10, more simply as a target charge curve 10. The target charge curve 10 represents change of the voltage relative to the current capacity at the time of charging the target battery OB. The target charge curve 10 can be shown as a graph where the horizontal axis represents the current capacity and the vertical axis represents the voltage.

Figure 2:
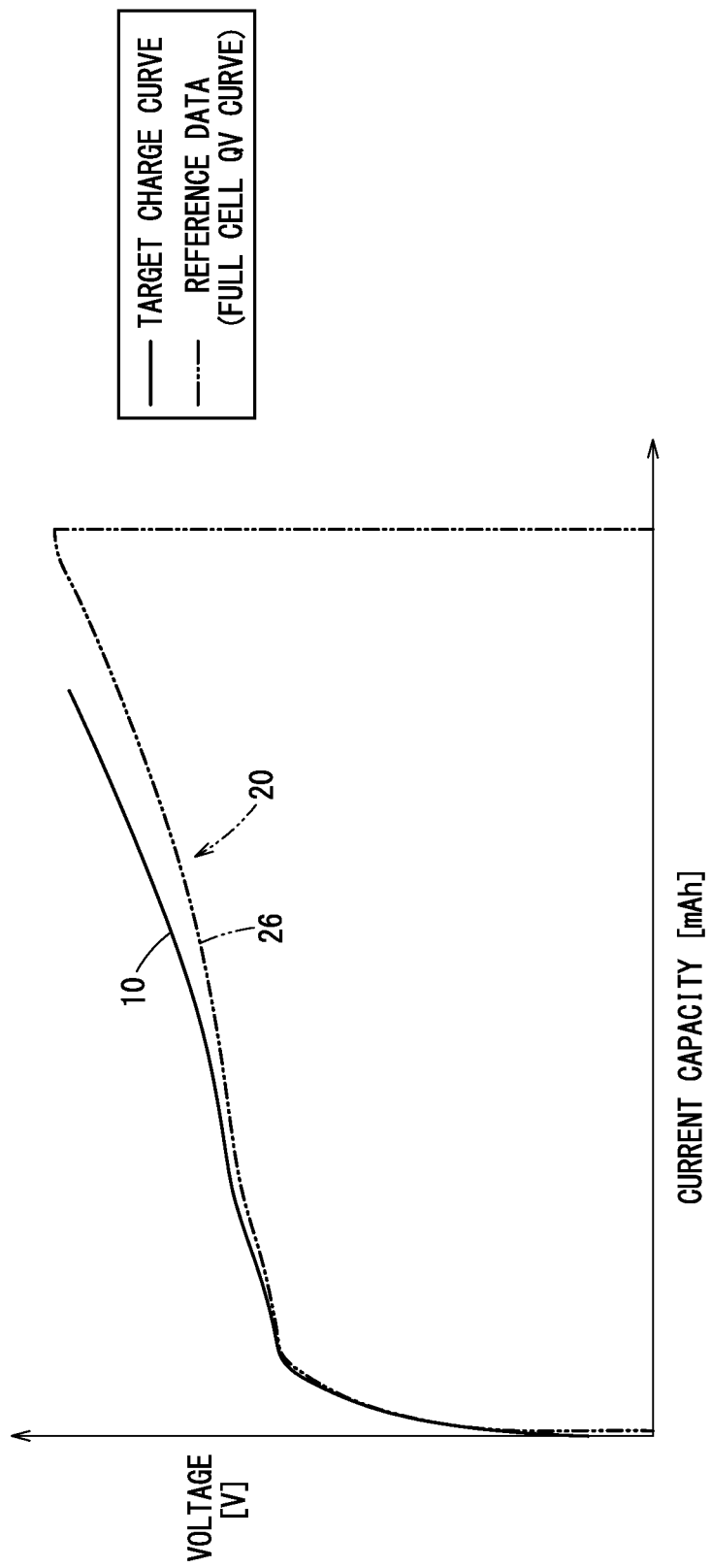
FIG. 2 is a graph showing a target charging curve of a target battery after degradation and reference data, by using the current capacity and the voltage.

As shown in FIGS. 1 and 2, known methods may be adopted for calculation of the target charge curve 10. As an example, the charge curve acquisition unit 146 calculates the accumulated charge current based on the charge current, the time, etc. required until the target battery OB having the charge SOC (State of Charge) of 0% is fully charged (SOC=100%) by the charger 120. This accumulated charge current corresponds to the current capacity. Therefore, the charge curve acquisition unit 146 plots the charge voltage in correspondence with increase in the accumulated charge current. In this manner, it is possible to obtain the target charge curve 10. The charge curve acquisition unit 146 obtains the target charge curve 10 (or a plurality of plots in which the current capacity and the charge voltage of the target charge curve 10 are associated with each other), and stores the target charge curve 10 in the storage unit 148. It should be noted that the prediction system 100 may calculate the target charge curve 10 by the data logger 142, and may transmit the target charge curve 10 to the information processing apparatus 144.

The storage unit 148 stores reference data 20 beforehand for carrying out the method of predicting capacity degradation, in addition to the target charge curve 10 obtained by the charge curve acquisition unit 146. In the embodiment of the present invention, the reference data 20 is data obtained by performing destructive testing of a battery of the same type as the target battery OB before degradation (unused brand new battery produced in the same method as the target battery OB).

The fitting unit 150 performs fitting operating of fitting the reference data 20 to information regarding the target charge curve 10 stored in the storage unit 148 to thereby estimate the capacity degradation of the target battery OB. Hereinafter, the factors of the capacity degradation of the secondary battery, and the details of the fitting operation will be described.

Figure 3:
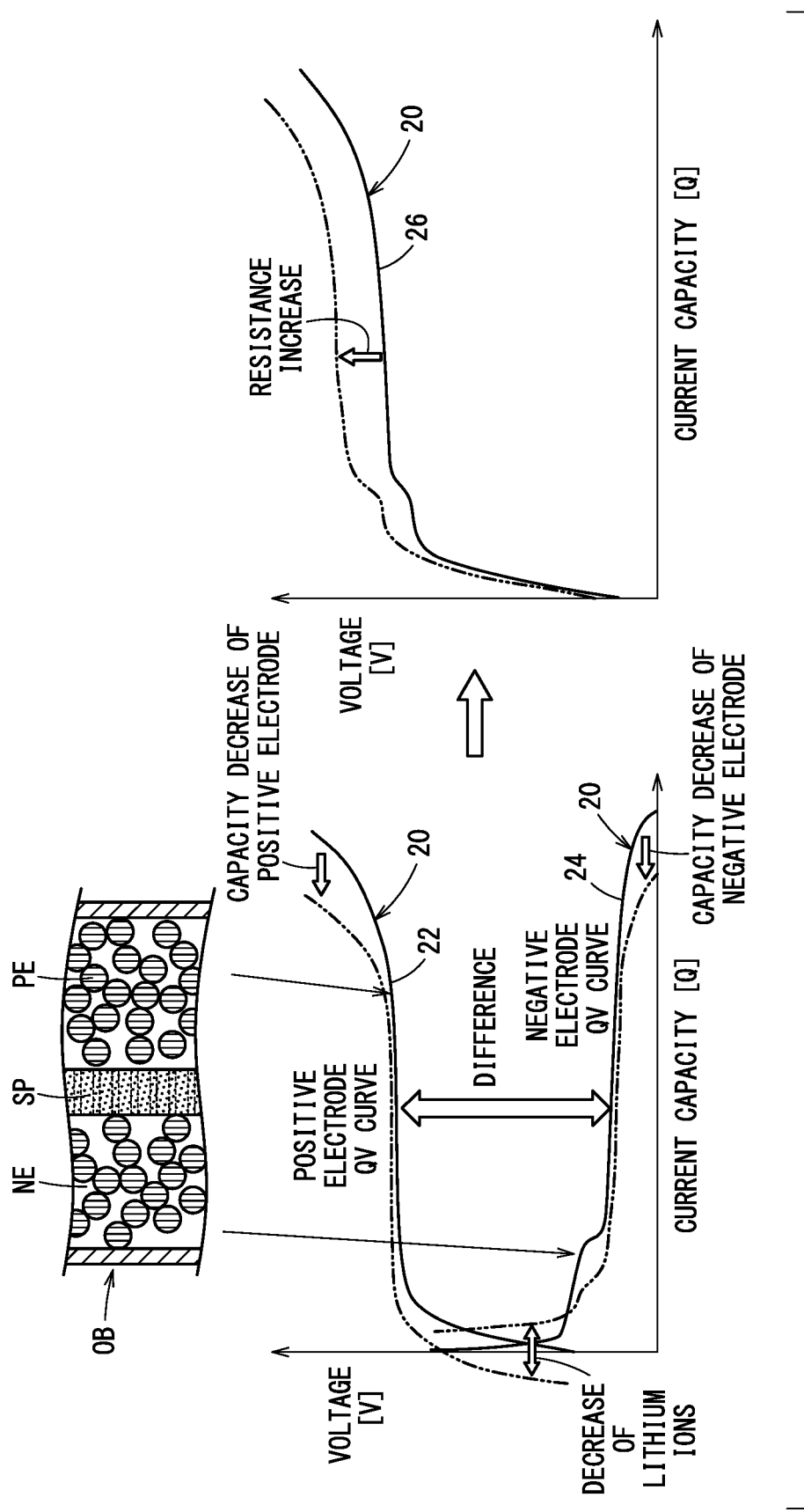
FIG. 3 is a graph illustrating a factor of the capacity degradation of a battery.

As shown in the left graph of FIG. 3, the secondary battery (lithium ion secondary battery) has a QV curve in each of the positive electrode PE and the negative electrode NE (hereinafter referred to as a positive electrode QV curve 22, a negative electrode QV curve 24). The positive electrode QV curve 22 and the negative electrode QV curve 24 are obtained by dividing (destructing) the secondary battery into the positive electrode PE and the negative electrode NE at a separator SP as a base point, attaching Li foil to the opposite electrode side of each of the positive electrode PE and the negative electrode NE across the separator, and thereafter, carrying out charging on each electrode, and monitoring the charge current and the charge voltage at the time of charging.

The positive electrode QV curve 22 is represented by a graph where the horizontal axis represents the current capacity [Q] and the vertical axis represents the voltage [V]. In the positive electrode QV curve 22, the voltage increases sharply within the interval in which the current capacity is small, thereafter the voltage remains substantially constant even with increase in the current capacity, and when the current capacity increases further, the increase rate of the voltage increases. On the other hand, in the negative electrode QV curve 24, the voltage decreases sharply within the interval in which the current capacity is low, thereafter the voltage remains substantially constant even with increase in the current capacity, and when the current capacity increases further, the decrease rate of the voltage decreases gradually. Further, as shown in the right graph of FIG. 3, the difference between the positive electrode QV curve 22 and the negative electrode QV curve 24 represents a charge curve between the pair of electrodes of the secondary battery. Hereinafter, the charge curve between the pair of the electrodes will be referred to as a full cell QV curve 26 in a sense that the fuel cell QV curve 26 is a curve of combination of the positive electrode PE and the negative electrode NE serving as half cells.

In this regard, the capacity degradation of the secondary battery is caused by the following four factors, and each of the factors appears in the positive electrode QV curve 22, the negative electrode QV curve 24, and the full cell QV curve 26. In FIG. 3, the positive electrode QV curve 22, the negative electrode QV curve 24, and the full cell QV curve 26 of the secondary battery subjected to degradation are illustrated by two dot chain lines.

(1) Capacity decrease of the positive electrode PE→decrease of the positive electrode QV curve 22 in the current capacity direction;

(2) Capacity decrease of the negative electrode NE→decrease of the negative electrode QV curve 24 in the current capacity direction;

(3) Decrease of lithium ions→deviation between the positive electrode QV curve 22 and the negative electrode QV curve 24 in the current capacity direction; and (4) Resistance increase→separation of the positive electrode QV curve 22 and the negative electrode QV curve 24 in the voltage direction=voltage offset of the full cell QV curve 26.

That is, there are four parameters in the capacity degradation of the secondary battery (the capacity decrease of the positive electrode PE, the capacity decrease of the negative electrode NE, the decrease of lithium ions, and the resistance increase). In the fitting operation, the positive electrode QV curve 22, the negative electrode QV curve 24, and the full cell QV curve 26 obtained by destructive testing of a reference battery are used as reference data 20, and the process of fitting the reference data 20 to the target charge curve 10 is performed. The information processing apparatus 144 analyzes the capacity degradation of the target battery OB based on the change amount of each of the parameters in this fitting operation.

In the fitting operation, the fitting unit 150 differentiates the current capacity by the voltage for the target charge curve 10 and the reference data 20 to calculate each of characteristic curves indicating feature points of the target charge curve 10 and feature points of the reference data 20. Then, the fitting unit 150 moves one of the target characteristic curve (not shown) obtained by differentiating the target charge curve 10 and the reference characteristic curve (the positive electrode characteristic curve, the negative electrode characteristic curve, and the full cell characteristic curve) obtained by differentiating the reference data 20 (the positive electrode QV curve 22, the negative electrode QV curve 24, and the full cell QV curve 26) for fitting to the other of the curves. Further, the fitting unit 150 performs fitting operation in order of the correlation strength (independence), i.e., from a pair of curved having the strong correlation between the target characteristic curve and the plurality of types of reference characteristic curves. As a result, it becomes possible for the fitting unit 150 to extract the changes of the parameters concerning the capacity degradation with high accuracy, and improve the reproducibility, the reliability, and easiness of understanding the capacity degradation of the battery to a greater extent.

Figure 4:
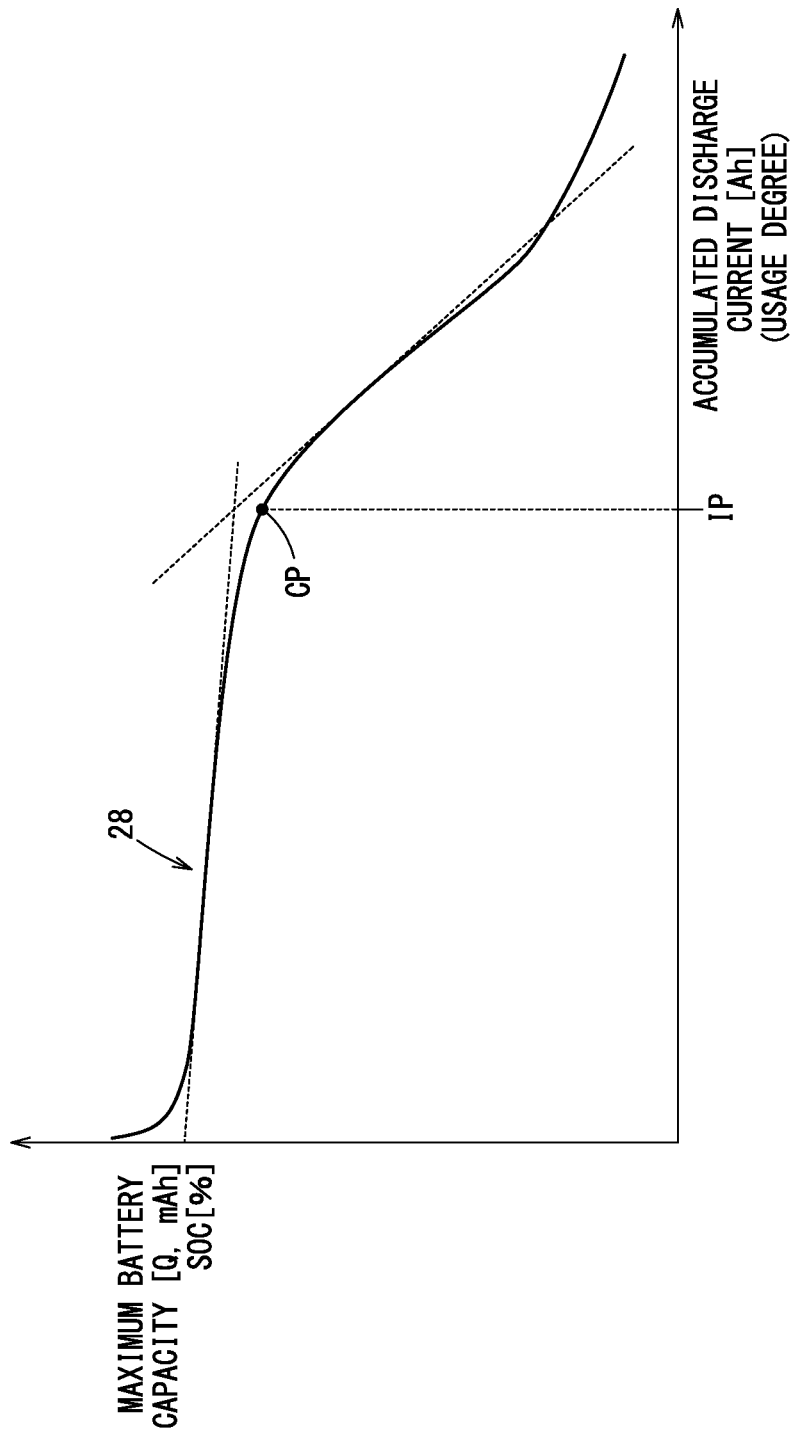
FIG. 4 is a graph showing decrease of the maximum battery capacity relative to the accumulated discharge current of the secondary battery.

Further, the degradation progress estimation unit 152 estimates the degradation speed (degradation progress rate) of the maximum battery capacity which is decreased (degraded) as a result of the use of the target battery OB, based on the parameters of the capacity degradation stored in the storage unit 148 by computation of the fitting unit 150. FIG. 4 is a graph where the horizontal axis represents the accumulated discharge current (usage degree) and the vertical axis represents the maximum battery capacity of the secondary battery. The graph shows a degradation speed curve 28 where, in the secondary battery, as the accumulated discharge current increases, the maximum battery capacity of the secondary battery decreases. As shown in FIG. 4, degradation of the maximum battery capacity of the secondary battery proceeds slowly in an initial usage period after starting the usage, and when the secondary battery is used continuously to some extent and then the degradation reaches a degradation change point CP (accumulated discharge current IP), in the subsequent usage period, the degradation proceeds rapidly over time. Hereinafter, the principle of estimating the degradation change point CP (accumulated discharge current IP) and the estimation method will be described.

The parameters of the capacity degradation of the secondary battery (the capacity decrease of the positive electrode PE, the capacity decrease of the negative electrode NE, the decrease of lithium ions, and the resistance increase) are related to the decrease of the maximum battery capacity due to the use of the secondary battery.

Figure 5B:
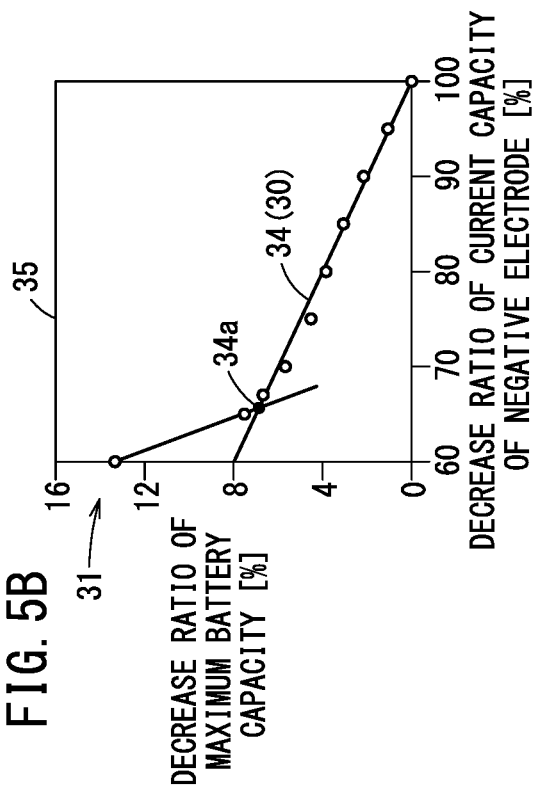
FIG. 5B is a graph showing a negative electrode-battery capacity decrease curve.
Figure 5D:
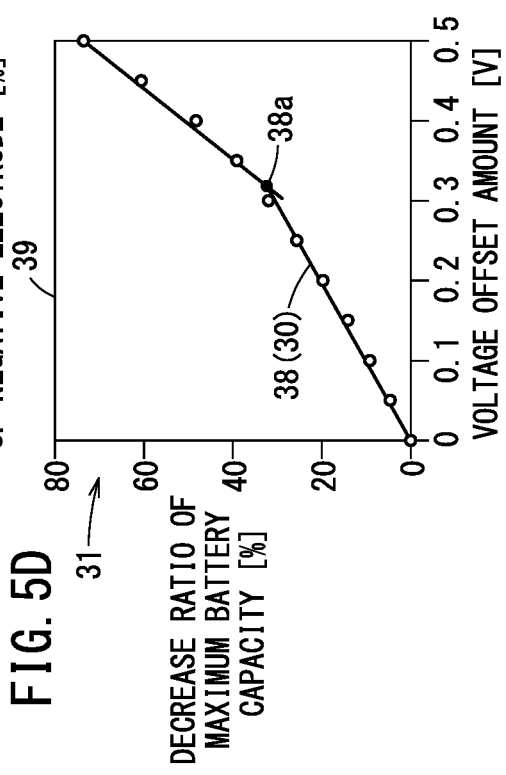
FIG. 5D is a graph showing an offset amount-battery capacity decrease curve.
Figure 5A:
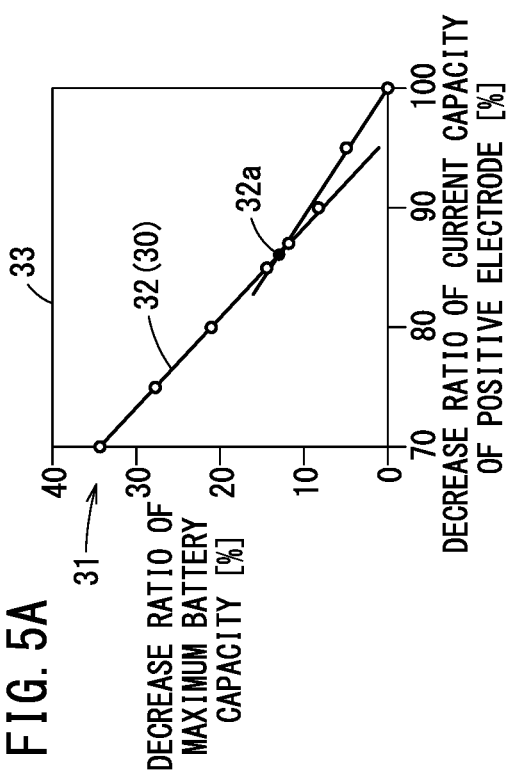
FIG. 5A is a graph showing a positive electrode-battery capacity decrease curve.

For example, FIG. 5A shows a positive electrode capacity change graph 33 with regard to the parameter concerning the capacity decrease of the positive electrode PE. In FIG. 5A, the horizontal axis represents the decrease ratio of the current capacity of the positive electrode PE, and the vertical axis represents the decrease ratio of the maximum battery capacity of the secondary battery. It should be noted that the decrease ratio of the maximum battery capacity is a proportion of a decrease amount of the maximum battery capacity which was caused after the usage of the secondary battery to the maximum battery capacity of the secondary battery before degradation (unused brand new secondary battery). Further, the decrease ratio of the current capacity of the positive electrode PE is calculated in percentage terms by subtracting a decrease amount of the current capacity of the positive electrode PE which was caused due to the use of the secondary battery from the current capacity (i.e., 100%) of the positive electrode PE before degradation.

With reference to the positive electrode capacity change graph 33, as the decrease ratio of the maximum battery capacity increases, the decrease of the current capacity of the positive electrode PE increases (the current capacity decreases from 100%). Hereinafter, the curve indicative of the decrease ratio of the maximum battery capacity with respect to the decrease of the current capacity of the positive electrode PE will be referred to as a positive electrode-battery capacity decrease curve 32.

Likewise, FIG. 5B shows a negative electrode capacity change graph 35 with regard to the parameter concerning the capacity decrease of the negative electrode NE. In FIG. 5B, the horizontal axis represents the decrease ratio of the current capacity of the negative electrode NE, and the vertical axis represents the decrease ratio of the maximum battery capacity of the secondary battery. It should be noted that the decrease ratio of the current capacity of the negative electrode NE is calculated in percent terms by subtracting a decrease amount of the current capacity of the negative electrode NE which was caused due to the use of the secondary battery from the current capacity of the negative electrode NE before degradation (i.e., the current capacity of 100%).

With reference to the negative electrode capacity change graph 35, as the decrease ratio of the maximum battery capacity increases, the decrease of the current capacity of the negative electrode NE increases (the current capacity decreases from 100%). Hereinafter, the curve indicative of the decrease ratio of the maximum battery capacity relative to the decrease of the current capacity of the negative electrode NE will be referred to as a negative electrode-battery capacity decrease curve 34.

Figure 5C:
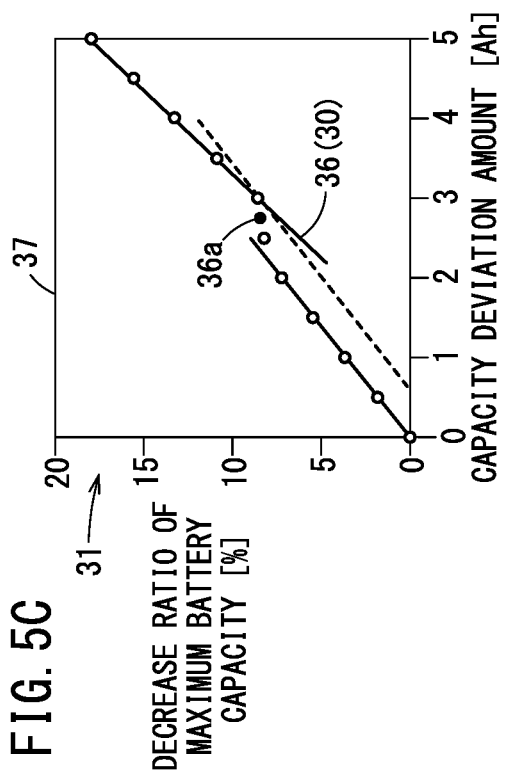
FIG. 5C is a graph showing a capacity deviation-battery capacity decrease curve.

Further, FIG. 5C shows a capacity deviation change graph 37 with regard to the parameter concerning the decrease of lithium ions (capacity deviation). In FIG. 5C, the horizontal axis represents the capacity deviation amount, and the vertical axis represents the decrease ratio of the maximum battery capacity of the secondary battery. It should be noted that the capacity deviation amount is a parameter which is proportional to the decrease amount of lithium ions.

With reference to the capacity deviation change graph 37, as the decrease ratio of the maximum battery capacity increases, the capacity deviation amount increases. Hereinafter, the curve showing the decrease ratio of the maximum battery capacity relative to this capacity deviation amount will be referred to as a capacity deviation-battery capacity decrease curve 36.

Further, FIG. 5D shows a voltage offset change graph 39 with regard to the parameter concerning the resistance increase (voltage offset). In FIG. 5D, the horizontal axis represents the voltage offset amount, and the vertical axis represents the decrease ratio of the maximum battery capacity of the second battery. It should be noted that the voltage offset amount is a parameter which is proportional to the resistance increase amount.

With reference to the voltage offset change graph 39, as the decrease ratio of the maximum battery capacity increases, the voltage offset amount increases. Hereinafter, the curve showing the decrease ratio of the maximum battery capacity relative to the voltage offset amount will be referred to as a offset amount-battery capacity decrease curve 38.

With reference to the change graphs 31 (the positive electrode capacity change graph 33, the negative electrode capacity change graph 35, the capacity deviation change graph 37, and the voltage offset change graph 39), it can be seen that, in each of the decrease curves 30 (the positive electrode-battery capacity decrease curve 32, the negative electrode-battery capacity decrease curve 34, the capacity deviation-battery capacity decrease curve 36, and the offset amount-battery capacity decrease curve 38), the gradient of the curve changes around a certain change point 32a, 34a, 36a, 38a as a starting point. For example, in the positive electrode-battery capacity decrease curve 32, the change point 32a is present at a position around 87% of the decrease ratio of the current capacity of the positive electrode PE. In the negative electrode-battery capacity decrease curve 34, the change point 34a is present at a position around 67% of the decrease ratio of the current capacity of the negative electrode NE. In the capacity deviation-battery capacity decrease curve 36, the change point 36a is present at a position around 2 Ah of the capacity deviation amount. In the offset amount-battery capacity decrease curve 38, the change point 38a is present at a position around 0.3 V of the voltage offset amount. Changes in the degradation speed occur at these change points 32a, 34a, 36a, and 38a when the maximum battery capacity of the secondary battery decreases. Therefore, the degradation progress estimation unit 152 estimates the degradation change point CP utilizing the change points 32a, 34a, 36a, 38a of the decrease curves 30.

Specifically, in the prediction system 100, the above fitting operation regarding the target battery OB before degradation is performed, and an initial process of storing each of the parameters of capacity degradation in the storage unit 148 is performed. Then, the degradation progress estimation unit 152 uses each parameter of the initial process stored in the storage unit 148 to perform the decrease curve generation process of generating the decrease curve 30 for each of the plurality of parameters.

In the decrease curve generation process, among the parameters, the degradation progress estimation unit 152 sets one parameter as a parameter to be changed in correspondence with the maximum battery capacity (QV energy, charge energy) and also sets the other parameters as parameters to be fixed. For example, in the case where the parameter of the capacity decrease of the positive electrode PE is set as the parameter to be changed in correspondence with change of the maximum battery capacity, the other parameters (concerning the capacity decrease of the negative electrode NE, the decrease of lithium ions, and the resistance increase) are fixed. Then, the degradation progress estimation unit 152 performs a QV simulation of decreasing the parameter of the current capacity of the positive electrode PE in correspondence with the decrease of the maximum battery capacity in the state where the other parameters are fixed.

The QV simulation uses the target charge curve 10 of the target battery OB before degradation, represented by the current capacity and the voltage. In the left graph of FIG. 6, an end on the high current capacity side of the target battery OB (right end: hereinafter referred to as a high current capacity end 10e) is approximated to the end of the current capacity of the positive electrode PE (positive electrode QV curve 22: see also FIG. 3). When the QV energy of the maximum battery capacity (area of the current capacity and the voltage) is reduced at a constant rate, the high current capacity end 10e moves in the decrease direction of the current capacity (horizontal axis of the left graph of FIG. 6). In the case where the QV energy is reduced at a constant rate without changing the height in the voltage direction, the decrease ratio (degradation speed) of the current capacity of the positive electrode PE is affected by the gradient of the negative electrode QV curve 24.

Figure 6:
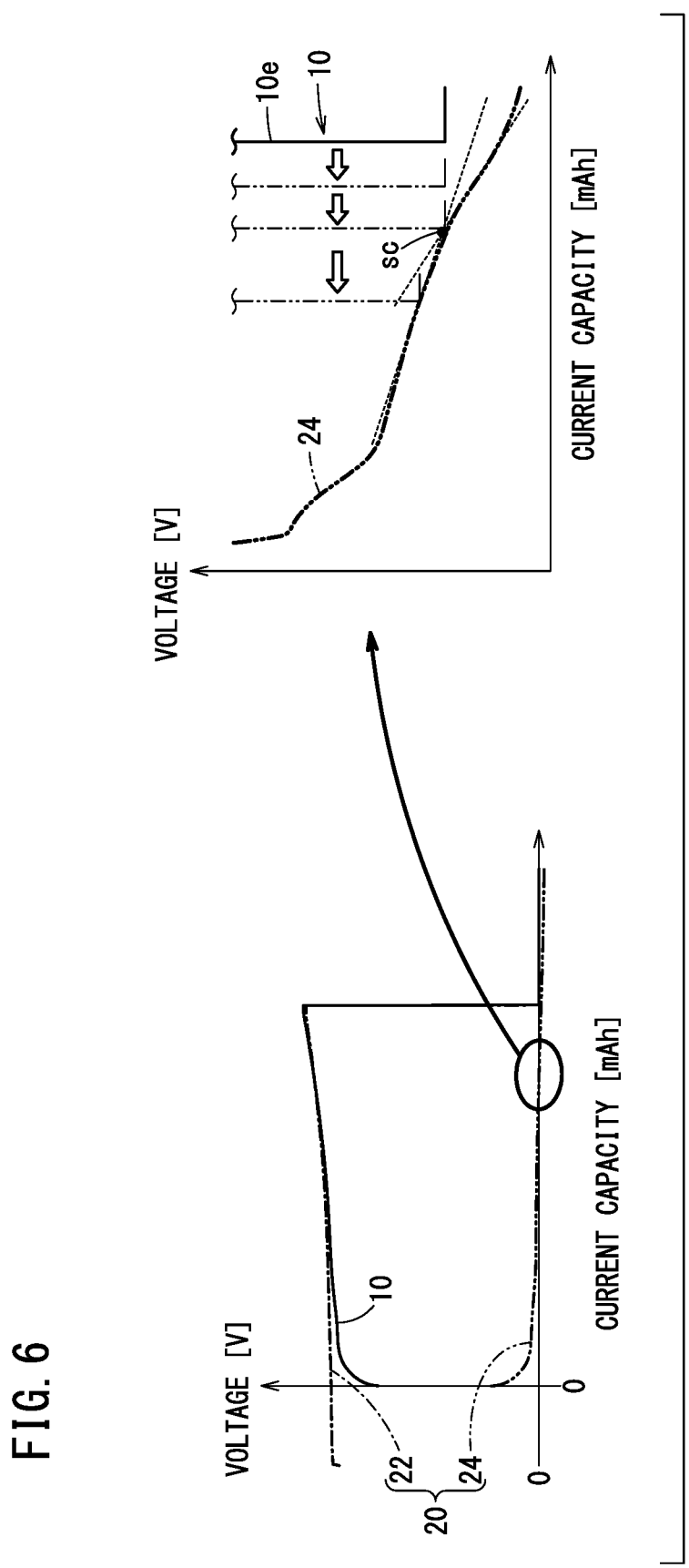
FIG. 6 is a graph illustrating a QV simulation.
Figure 8A:
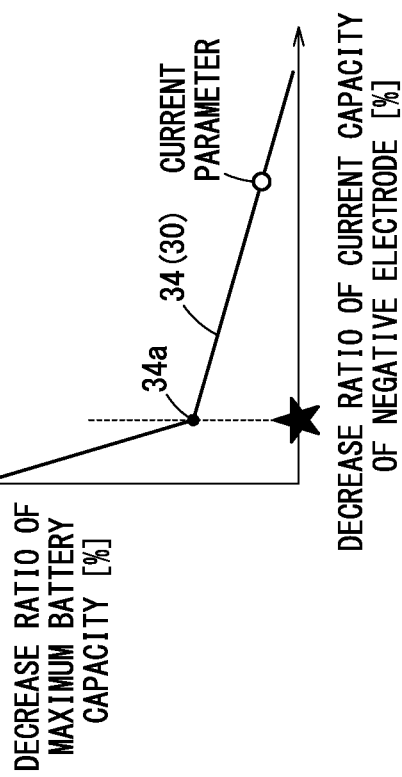
FIGS. 8A, 8B, 8C, and 8D are graphs illustrating a first step of an identification process.
Figure 8B:
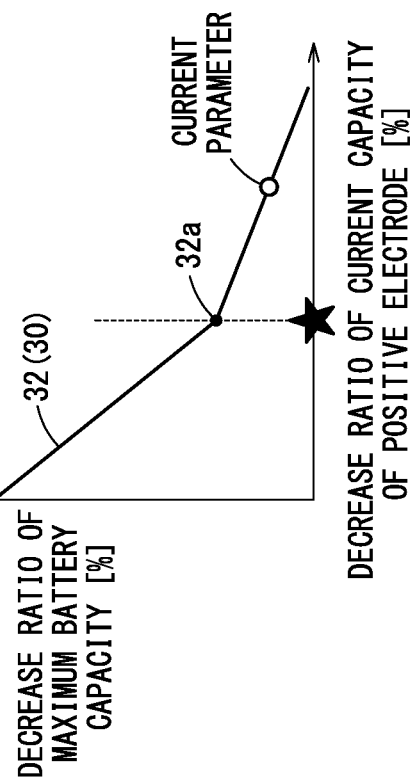
Figure 8C:
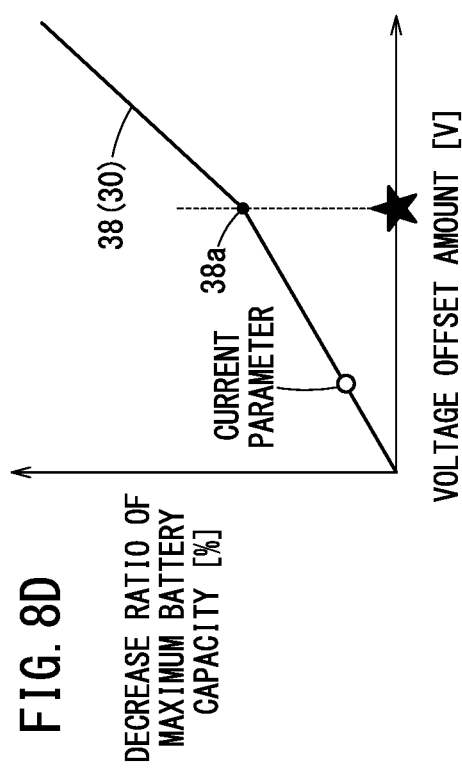
Figure 8D:
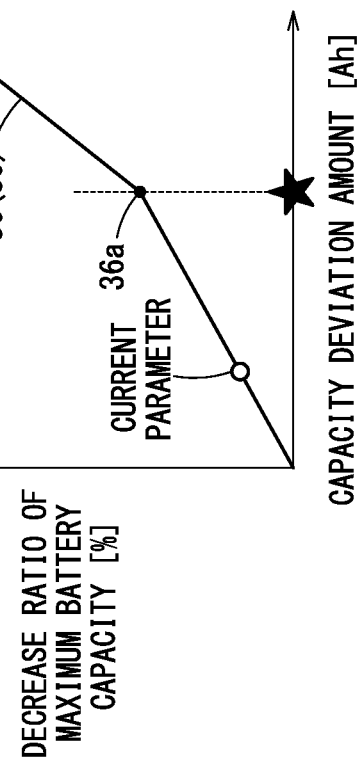
Figure 9A:
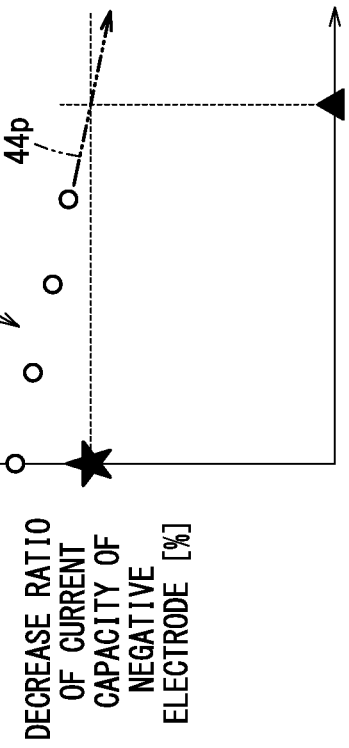
FIGS. 9A, 9B, 9C, and 9D are graphs illustrating a second step the identification process.
Figure 9B:
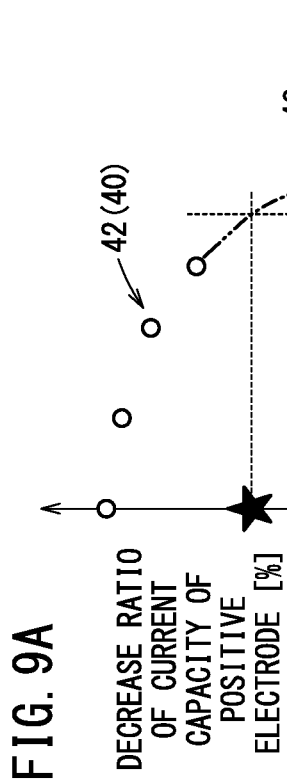
Figure 9C:
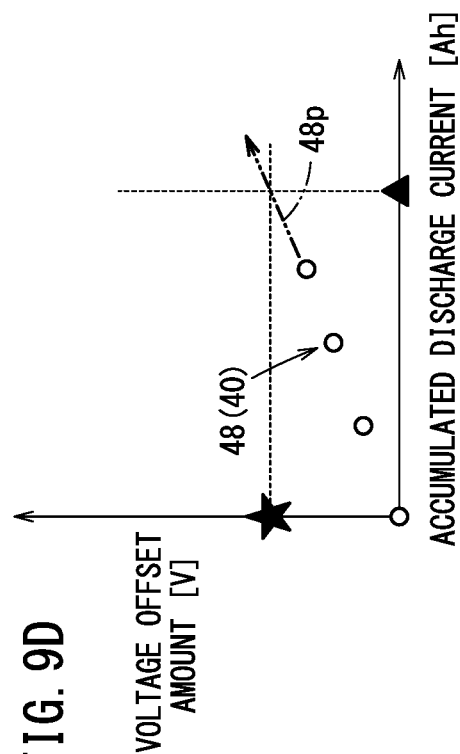
Figure 9D:
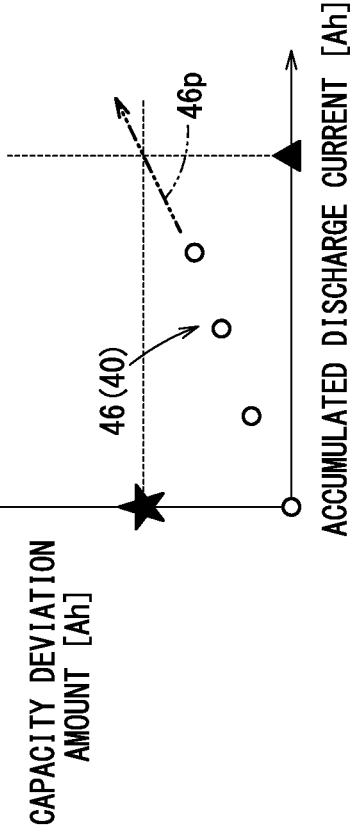
Figure 10A:
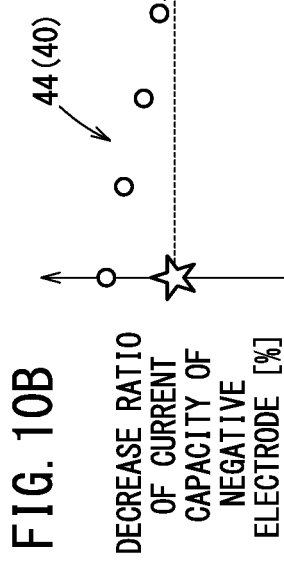
FIGS. 10A, 10B, 10C, and 10D are graphs illustrating a third step of the identification process.
Figure 10B:
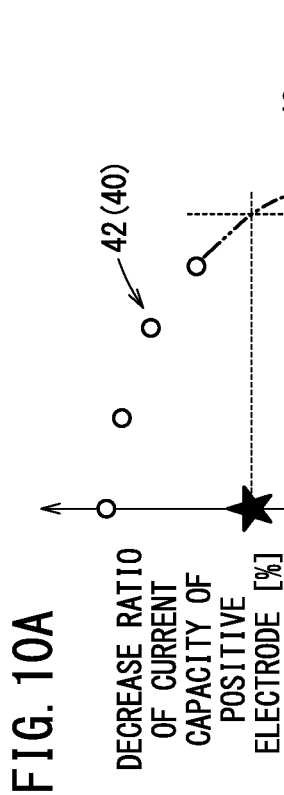
Figure 10C:
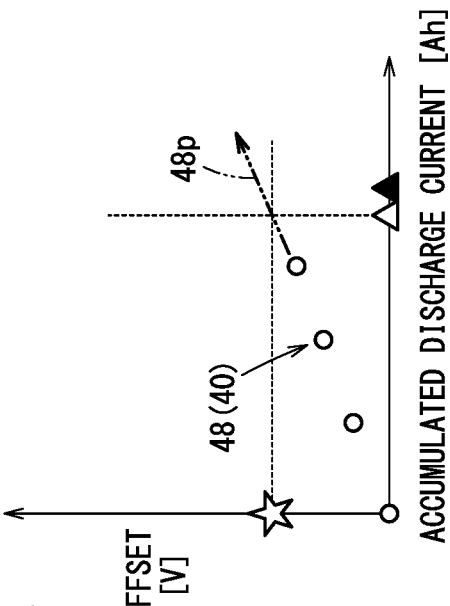
Figure 10D:
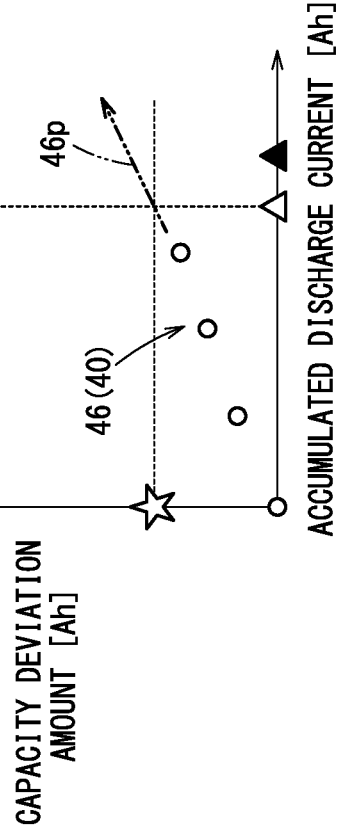
Figure 11A:
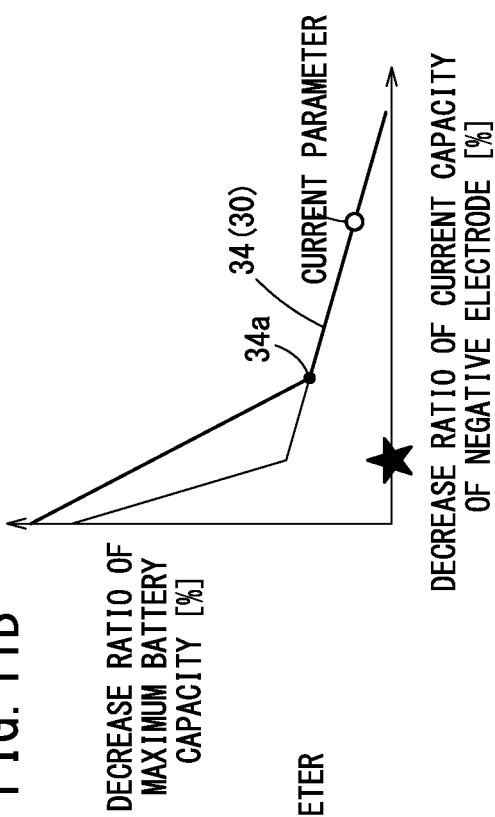
FIGS. 11A, 11B, 11C, and 11D are graphs illustrating a fourth step of the identification process.
Figure 11B:
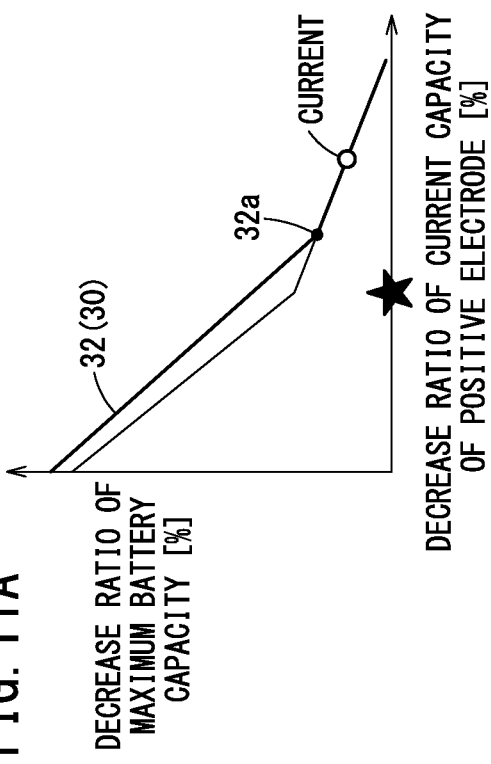
Figure 11C:
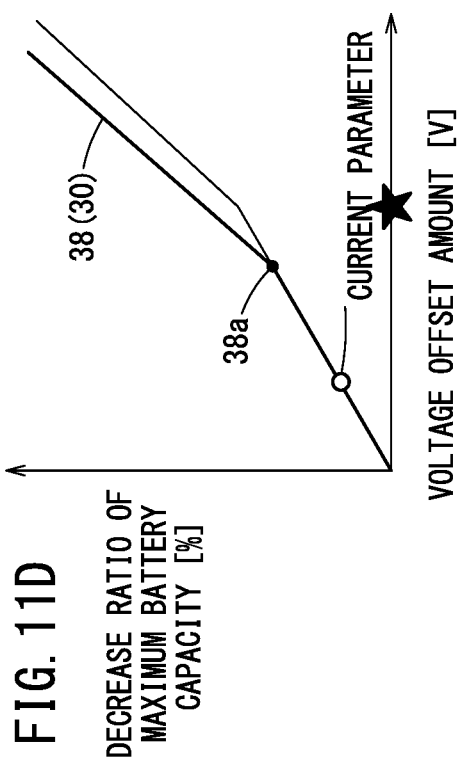
Figure 11D:
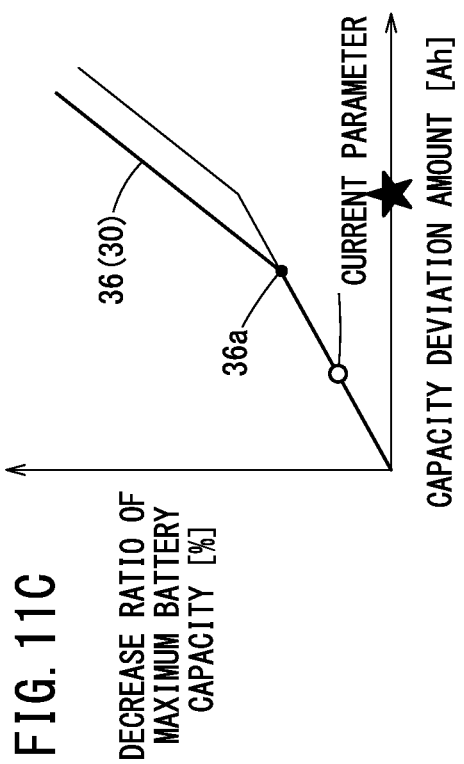

At this time, when the negative electrode QV curve 24 is enlarged as shown in the right graph in FIG. 6, in the case where the current capacity is converted into SOC, the negative electrode QV curve 24 has a gradient change point sc where the gradient changes, at the position of SOC=87%. That is, in the negative electrode QV curve 24, the gradient is steep on the high current capacity side of the gradient change point sc, and the gradient is gradual on the low current capacity side of the gradient change point sc. Therefore, when the QV energy is reduced at a constant rate to move the high current capacity end 10e, on the high current capacity side where the gradient of the negative electrode QV curve 24 is steep, the decrease amount of the current capacity in the decrease direction is small, and on the low current capacity side where the gradient of the negative electrode QV curve 24 is gradual, the decrease amount of the current capacity in the decrease direction is large.

That is, in the case where the high current capacity end 10e approximated to the current capacity of the positive electrode PE moves in the decrease direction of the current capacity as a result of decrease of the QV energy, the decrease speed is low up to the gradient change point sc, and the decrease speed becomes high after the gradient change point sc. As a consequence, in the positive electrode capacity change graph 33 shown in FIG. 5A, it can be seen that the change point 32a of the positive electrode-battery capacity decrease curve 32 is largely affected by the gradient change point sc. Further, by performing the QV simulation where the parameter of the capacity decrease of the positive electrode PE is varied with the parameters other than the capacity decrease of the positive electrode PE being fixed, the degradation progress estimation unit 152 can obtain the positive electrode-battery capacity decrease curve 32 shown in FIG. 5A. Also concerning the other parameters (the capacity decrease of the negative electrode NE, the decrease of the lithium ions, and the resistance increase), in the same manner, the negative electrode-battery capacity decrease curve 34 shown in FIG. 5B, the capacity deviation-battery capacity decrease curve 36 shown in FIG. 5C, and the offset amount-battery capacity decrease curve 38 shown in FIG. 5D can be obtained.

Further, the degradation progress estimation unit 152 obtains each of the parameters of the capacity degradation, based on the fitting operation as described above for the current target battery OB (i.e., the degraded target battery OB). As a result, the degradation progress estimation unit 152 can recognize the position of the current parameter (white circles in FIGS. 5A to 5D) in each of the positive electrode-battery capacity decrease curve 32, the negative electrode-battery capacity decrease curve 34, the capacity deviation-battery capacity decrease curve 36, and the offset amount-battery capacity decrease curve 38.

Further, in estimation of the degradation change point CP, the degradation progress estimation unit 152 performs a usage degree curve generation process. In the usage degree curve generation process, each of the parameters of the capacity degradation of the target battery OB is applied to a plurality of parameter usage degree graphs 41 shown in FIGS. 7A to 7D to generate a usage degree curve 40 represented by the accumulated discharge current and the parameters. In calculation of each of the usage degree curves 40, the degradation progress estimation unit 152 reads each of the parameters before degradation, one or more parameters after degradation, and the accumulated discharge current stored in the storage unit 148.

The parameter usage degree graph 41 shown in FIG. 7A is a positive electrode usage degree graph 43 where the horizontal axis represents the accumulated discharge current and the vertical axis represents the decrease ratio of the current capacity of the positive electrode PE. A usage degree-positive electrode capacity curve 42 is formed on this graph. The usage degree-positive electrode capacity curve 42 is plotted based on the read plurality of parameters of the current capacity decrease of the positive electrode PE and the accumulated discharge current associated with these parameters.

The parameter usage degree graph 41 shown in FIG. 7B is a negative electrode usage degree graph 45 where the horizontal axis represents the accumulated discharge current and the vertical axis represents the decrease ratio of the current capacity of the negative electrode NE. A usage degree-negative electrode capacity curve 44 is formed on this graph. The usage degree-negative electrode capacity curve 44 is plotted based on the read plurality of parameters of the current capacity decrease of the negative electrode NE and the accumulated discharge current associated with these parameters.

The parameter usage degree graph 41 shown in FIG. 7C is a capacity deviation usage degree graph 47 where the horizontal axis represents the accumulated discharge current and the vertical axis represents the capacity deviation amount. A usage degree-capacity deviation curve 46 is formed on this graph. The usage degree-capacity deviation curve 46 is plotted based on the read plurality of parameters of the capacity deviation amount and the accumulated discharge current associated with these parameters.

The parameter usage degree graph 41 shown in FIG. 7D is a voltage offset usage degree graph 49 where the horizontal axis represents the accumulated discharge current and the vertical axis represents the voltage offset amount. A usage degree-offset amount curve 48 is formed on this graph. The usage degree-offset amount curve 48 is plotted based on the read plurality of parameters of the voltage offset amount and the accumulated discharge current associated with these parameters.

Further, the degradation progress estimation unit 152 predicts change of each of the parameters relative to the accumulated discharge current from the change tendency of each of the formed usage degree curves 40. For example, by predicting the change of the parameter relative to the accumulated discharge current, the degradation progress estimation unit 152 reads data of the change tendency (the change rate or the change amount) with regard to each of one or more parameters of capacity degradation, for each of parameters of capacity degradation before degradation. The data of the change tendency of each of the read parameters is obtained by experiments of simulations. The degradation progress estimation unit 152 applies (or correlates) each of the one or more parameters of capacity degradation after degradation to the read data of the change tendency. In this manner, the degradation progress estimation unit 152 can calculate prediction curves 42p, 44p, 46p, 48p where each of the parameters changes relative to the accumulated discharge current, as shown by two dot chain lines in FIGS. 7A to 7D.

As described above, the degradation progress estimation unit 152 obtains the decrease curve 30 of each of the parameters by the decrease curve generation process, and also obtains the usage degree curve 40 of each of the parameters by the usage degree curve generation process. The degradation progress estimation unit 152 performs an identification process of identifying the parameter which most affects the degradation change point CP of the target battery OB based on the obtained decrease curve 30 and the usage degree curve 40.

Specifically, as shown in FIGS. 8A to 8D, as a result of the decrease curve generation process, each of the decrease curves 30 has the change point 32a, 34a, 36a, 38a as described above. In the identification process, the degradation progress estimation unit 152 performs a first step of extracting a value of the change point 32a, 34a, 36a, 38a on the horizontal axis, in each decrease curve 30 (see blackened star marks in FIGS. 8A to 8D). That is, the degradation progress estimation unit 152 acquires the decrease ratio of the current capacity of the positive electrode PE from the change point 32a on the positive electrode-battery capacity decrease curve 32, acquires the decrease ratio of the current capacity of the negative electrode NE from the change point 34a on the negative electrode-battery capacity decrease curve 34, acquires the capacity deviation amount from the change point 36a on the capacity deviation-battery capacity decrease curve 36, and acquires the voltage offset amount from the change point 38a on the offset amount-battery capacity decrease curve 38.

Next, as shown in FIG. 9A to 9D, the degradation progress estimation unit 152 performs a second step of applying the value of the horizontal axis extracted in the first step to each of the parameter usage degree graphs 41 and extracting an accumulated discharge current from each of the parameter usage degree graphs. That is, the degradation progress estimation unit 152 extracts the accumulated discharge current of each of the parameters (blackened triangle marks on the horizontal axis in FIGS. 9A to 9D), in the case where the value of the horizontal axis (the decrease ratio of the current capacity of the positive electrode PE, the decrease ratio of the current capacity of the negative electrode NE, the capacity deviation amount, and the voltage offset amount) is applied to the usage degree curve 40. The degradation progress estimation unit 152 can recognize the minimum accumulated discharge current among each of the parameters (see white triangle mark in FIG. 9A), from the extracted accumulated discharge currents.

Then, as shown in FIGS. 10A to 10D, the degradation progress estimation unit 152 performs a third step of applying the obtained minimum discharge current to each of the other parameter usage degree graphs 41 to obtain a value of each of the parameters (see white triangle marks on the horizontal axis in FIGS. 10A to 10D), relative to the minimum accumulated discharge current. For example, in the case where the accumulated discharge current of the usage degree-positive electrode capacity curve 42 is the minimum, the accumulated discharge current thereof is applied to the other curves, i.e., the usage degree-negative electrode capacity curve 44, the usage degree-capacity deviation curve 46, and the usage degree-offset amount curve 48. Thus, the values of the decrease ratio of the current capacity of the positive electrode PE, the decrease ratio of the current capacity of the negative electrode NE, the capacity deviation amount, the voltage offset amount, at the minimum accumulated discharge current, are obtained.

Further, as shown in FIGS. 11A to 11D, the degradation progress estimation unit 152 performs a fourth step of applying the values (parameters of the capacity degradation) obtained in the third step to the respective change graphs 31 to deform each decrease curve 30 based on each of the values. That is, since the decrease ratio of the maximum battery capacity changes due to the influence of each of the parameters, the degradation progress estimation unit 152 changes the shape of each of the decrease curves 30 by the QV simulation in correspondence with the values obtained in the third step. In accordance with each of the deformed decrease curves 30, each of the change points 32a, 34a, 36a, 38a moves in the direction closer to the current parameter. Thus, by repeating the first to fourth steps, the degradation progress estimation unit 152 can gradually change the shape and the change point 32a, 34a, 36a, 38a of each of the decrease curves 30.

The process of repeating the first to fourth steps is a process of inversely calculating how each of the parameters of capacity degradation changes relative to each of the change points 32a, 34a, 36a, 38a. This process is performed until one of the change points 32a, 34a, 36a, 38a of the positive electrode-battery capacity decrease curve 32, the negative electrode-battery capacity decrease curve 34, the capacity deviation-battery capacity decrease curve 36, and the offset amount-battery capacity decrease curve 38 reaches the corresponding parameter of capacity degradation.

Further, with regard to that decrease curve 30 where the change point 32a, 34a, 36a, 38a firstly reaches the current parameter of capacity degradation, the degradation progress estimation unit 152 recognizes that the increase of the accumulated discharge current most affects the degradation change point CP. The degradation progress estimation unit 152 selects the parameter of capacity degradation indicating the recognized decrease curve 30 and the corresponding usage degree curve 40. The degradation progress estimation unit 152 then determines the accumulated discharge current IP (degradation change point CP) from the change point of the decrease curve 30, and stores the accumulated discharge current IP in the storage unit 148. Further, after having determined the degradation change point CP, the degradation progress estimation unit 152 calculates the accumulated discharge current (or the time length) from the current accumulated discharge current to the degradation change point CP. By the above process, with the capacity degradation prediction method, it is possible to accurately estimate the degradation change point CP (accumulated discharge current IP) and the time it takes to reach the degradation change point CP.

The prediction system 100 according to the embodiment of the present invention has the structure as described above. Hereinafter, the process flow of the capacity degradation prediction method will be described with reference to FIG. 12.

In the method of predicting capacity degradation of the secondary battery, firstly, a user of the prediction system 100 performs an initial process of obtaining each of the initial parameters of capacity degradation for the target battery OB before degradation (step S10). In the initial process, the prediction system 100 performs charging of the target battery OB before degradation by the charger 120, and accumulates the charge current and the charge voltage at the time of charging in the data logger 142. Then, the information processing apparatus 144 obtains an initial charge curve (not shown) based on the charge current and the charge voltage. Thereafter, the information processing apparatus 144 performs a fitting operation of the initial charge curve and the reference data 20 (the positive electrode QV curve 22, the negative electrode QV curve 24, and the full cell QV curve 26). The reference data 20 is obtained beforehand by destructive testing of a battery of the same type as the target battery OB.

As a result of this initial process, the prediction system 100 and the user can recognize the initial state of each of the parameters of the capacity degradation. The prediction system 100 stores the parameters of the capacity decrease of the positive electrode PE, the capacity decrease of the negative electrode NE, the decrease of lithium ions, and the resistance increase, concerning the target battery OB before degradation obtained in the initial process, in the storage unit 148.

Next, in the capacity degradation prediction method, the actual estimation process of obtaining parameters of the capacity degradation concerning the target battery OB after degradation is performed (step S20). In the actual estimation process, the prediction system 100 performs charging of the target battery OB after degradation by the charger 120, and accumulates the charge current and the charge voltage at the time of charging, in the data logger 142. Then, the information processing apparatus 144 obtains the target charge curve 10 based on the charge current and the charge voltage. Thereafter, the information processing apparatus 144 performs the fitting operation of the target charge curve 10 and the reference data 20 (the positive electrode QV curve 22, the negative electrode QV curve 24, the full cell QV curve 26). As a result of the fitting operation, it is possible to obtain the parameters of the capacity decrease of the positive electrode PE, the capacity decrease of the negative electrode NE, the decrease of lithium ions, and the resistance increase, concerning the target battery OB after degradation. Further, at the time of storing the parameters, the prediction system 100 obtains the accumulated discharge current of the target battery OB, and stores the accumulated discharge current associated with the parameters, in the storage unit 148.

For example, as described above, in the fitting operation in steps S10, S20, a characteristic curve is calculated for each of the target charge curve 10, the positive electrode QV curve 22, the negative electrode QV curve 24, and the full cell QV curve 26 by differentiating the current capacity by the voltage. Then, the fitting unit 150 performs the fitting operation of the characteristic curves in the order that the correlation (independence) is the strongest. In this manner, it is possible to calculate each of the parameters of capacity degradation accurately. Preferably, the actual estimation process of obtaining the parameters of capacity degradation as described above is performed multiple times, after the target battery OB has been used for an arbitrary period of time.

Figure 13:
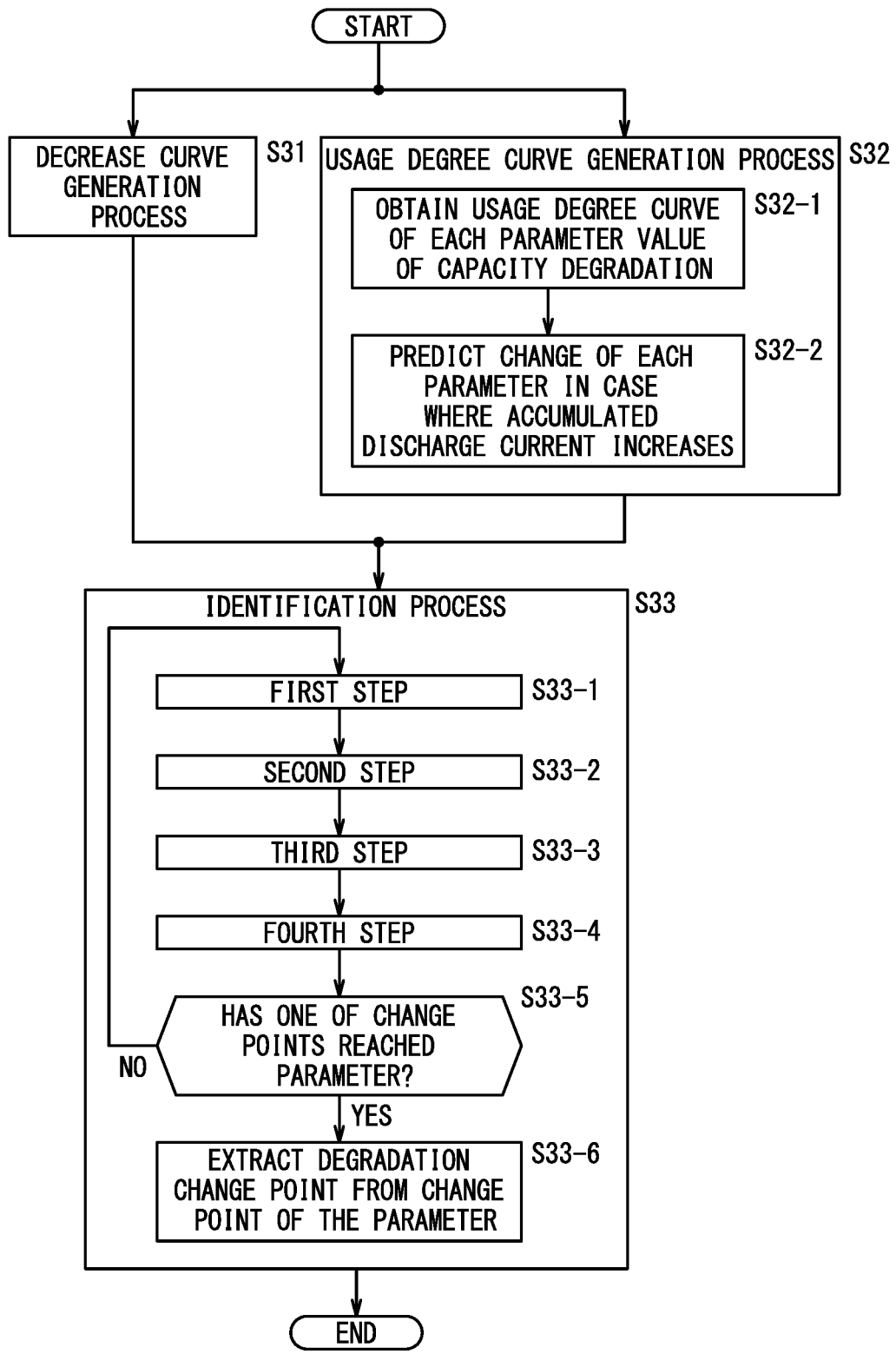
FIG. 13 is a flow chart showing a process of a change point estimation process.

Thereafter, the information processing apparatus 144 performs the change point estimation process of deriving the degradation change point CP (step S30). At this time, as shown in FIG. 13, for each of the parameters, the degradation progress estimation unit 152 performs the decrease curve generation process of obtaining the decrease curve 30 (step S31), and performs the usage degree curve generation process of obtaining the usage degree curve 40 (step S32). Then, lastly, the degradation progress estimation unit 152 performs the identification process of deriving the degradation change point CP using each of the decrease curves 30 and each of the usage degree curves 40 (step S33).

In the decrease curve generation process, the degradation progress estimation unit 152 generates each of the decrease curves 30 shown in FIGS. 5A to 5D by performing the QV simulation based on each of the parameters of capacity degradation before degradation. As described above, in the QV simulation, among the parameters of capacity degradation, one parameter is changed by decreasing the QV energy at a constant ratio with the other parameters being fixed, whereby points of the changed parameter are extracted (plotted). In this manner, the degradation progress estimation unit 152 can obtain the positive electrode-battery capacity decrease curve 32, the negative electrode-battery capacity decrease curve 34, the capacity deviation-battery capacity decrease curve 36, the offset amount-battery capacity decrease curve 38, which are represented by a plurality of extraction points of the parameters and the decrease ratio of the maximum battery capacity of the target battery OB. Further, each of the positive electrode-battery capacity decrease curve 32, the negative electrode-battery capacity decrease curve 34, the capacity deviation-battery capacity decrease curve 36, and the offset amount-battery capacity decrease curve 38 has the change point 32a, 34a, 36a, 38a.

In the usage degree curve generation process, the degradation progress estimation unit 152 generates each of the usage degree curves 40 shown in FIGS. 7A to 7D based on the parameters of capacity degradation before degradation, the parameters of the capacity degradation after degradation, and the accumulated discharge current. As described above, the degradation progress estimation unit 152 arranges the usage degree (accumulated discharge current) and plots of the parameters concerning the capacity degradation before degradation and after degradation, in each of the parameter usage degree graphs 41 to obtain the usage degree curve 40 of each of the parameter values of the capacity degradation relative to the accumulated discharge current (step S32-1).

Further, the degradation progress estimation unit 152 predicts change of each parameters in the case where the accumulated discharge current is increased from the current point, using each usage degree curve 40 on each parameter usage degree graph 41 (step S32-2). In this manner, the degradation progress estimation unit 152 obtains the prediction curves 42p, 44p, 46p, 48p shown by two dot chain lines in FIGS. 7A to 7D, for the parameters.

Lastly, in the identification process, the degradation progress estimation unit 152 repeats the first to fourth steps to identify the degradation change point CP of the target battery OB. That is, in the first step (step S33-1), the degradation progress estimation unit 152 extracts a value, on the horizontal axis, of the change point 32a, 34a, 36a, 38a of each of the decrease curves 30 in the change graphs 31 (see FIGS. 8A to 8D). In the second step (step S33-2), the degradation progress estimation unit 152 applies the value of each change point on the horizontal axis extracted in the first step to the corresponding parameter usage degree graph 41, and extracts the accumulated discharge current corresponding to the value, in each parameter usage degree graph 41 (see FIGS. 9A to 9D). In the third step (step S33-3), the degradation progress estimation unit 152 applies the minimum accumulated discharge current, among the accumulated discharged currents, to the other parameter usage degree graphs 41, and extracts the value of each parameter (vertical axis). In the fourth step (step S33-4), the degradation progress estimation unit 152 applies the value of each parameter obtained in the third step to each decrease curve 30, and deform each decrease curve 30.

Then, in step S33-5, the degradation progress estimation unit 152 determines whether or not one of the change points 32a, 34a, 36a, 38a of the deformed decrease curves 30 has reached the current parameter. In the case where none of the change points 32a, 34a, 36a, 38a has reached the current parameter, the routine returns to step S33-1, and repeat the same process. In the case where one of the change points 32a, 34a, 36a, 38a has reached a current parameter, from the usage degree curve 40 corresponding to the parameter (see FIGS. 9A to 9D), the accumulated discharge current corresponding to the change point is extracted as the accumulated discharge current IP (see FIG. 4) of the degradation change point CP (step S33-6).

By performing this identification process, the degradation progress estimation unit 152 can accurately estimate the degradation change point CP (accumulated discharge current IP) in consideration of each parameter concerning the capacity degradation for the target battery OB. After having performed the change point estimation process as described above, the prediction system 100 generates and indicates a graph shown in FIG. 4, for example, through a notification means such as a monitor (not shown), and notifies the user of the degradation change point CP. Further, the prediction system 100 may notify the user of the accumulated discharge current (or the time length based on the accumulated discharge current, etc.) from the current state of the target battery OB up to the degradation change point CP.

The present invention is not limited to the above described embodiment, and various modification can be made in line with the gist of the present invention. For example, in the third step of the identification process, with regard to a parameter concerning capacity degradation where the minimum accumulated discharge current is extracted (see FIGS. 10A to 10D), the change point of the parameter may be used as the degradation change point CP of the target battery OB. In this manner, in the capacity degradation prediction method, it is possible to promptly obtain the degradation change point CP.

Alternatively, in the fitting operation, the prediction system 100 may use the change point of the parameter concerning capacity degradation having the strongest correlation (e.g., the parameter of the capacity decrease of the negative electrode) as the degradation change point CP of the target battery OB. That is, it can be considered that the decrease of the maximum battery capacity of the target battery OB is affected easily by the parameter having the strongest correlation. Therefore, the parameter having the strongest correlation is identified as the most influential factor which causes degradation of the target battery OB. In this manner, with the capacity degradation prediction method, it is possible to more easily estimate the degradation change point CP.

Figure 14:
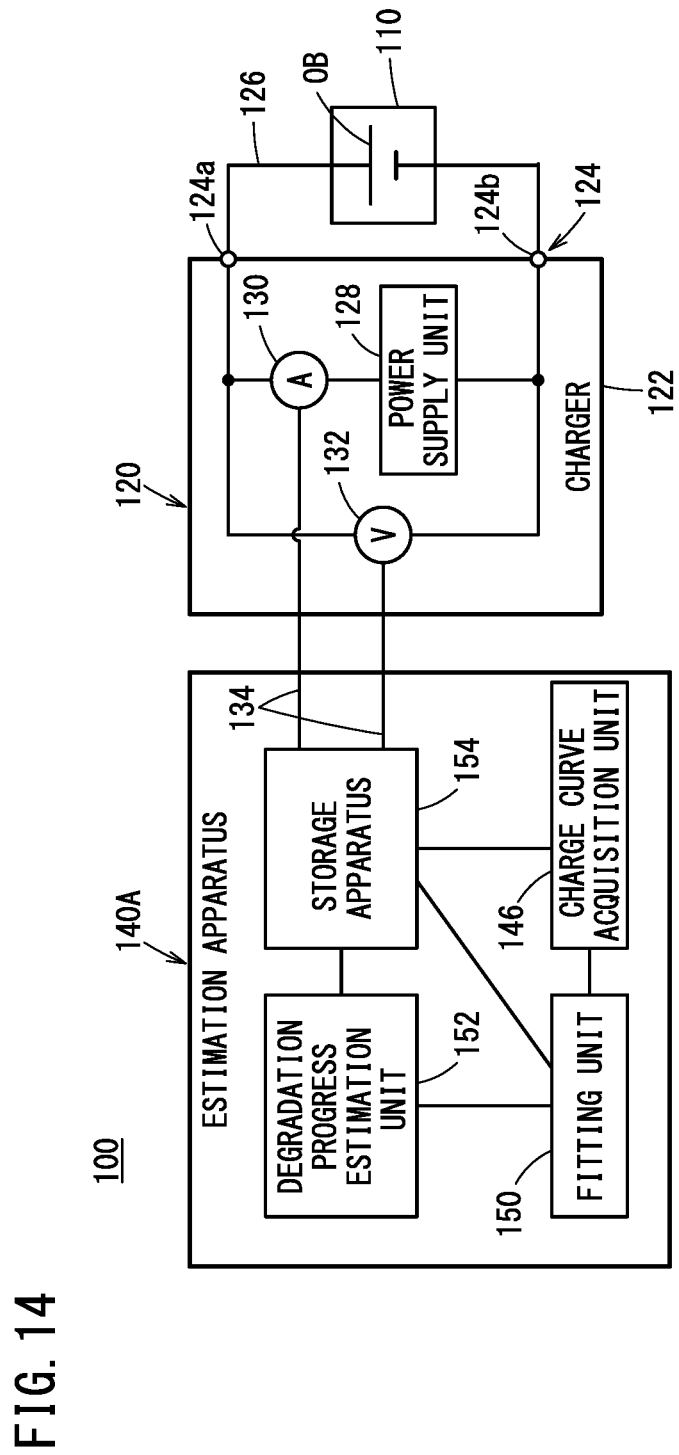
FIG. 14 is a diagram showing a prediction system according to a modified embodiment.

Further, for example, an estimation apparatus 140A of the prediction system 100 according to a modified embodiment shown in FIG. 14 is configured to include a storage apparatus 154 incorporating the data logger 142 and the storage unit 148, as shown in FIG. 1. By using such a single storage apparatus 154 which stores various items of data, it is possible to simplify the structure of the prediction system 100 to a greater extent.

The technical concept and advantageous effects understood from the above embodiment will be described below.

According to a first aspect of the present invention, a capacity degradation prediction method of predicting capacity degradation of a secondary battery is provided. The method includes the steps of performing an actual estimation process of obtaining the target charge curve (target-battery charge curve) 10, represented by the current capacity and the voltage, of the target battery OB as a target of estimation of capacity degradation, and obtaining changes of a plurality of parameters concerning capacity degradation, based on fitting operation of fitting, to the obtained target charge curve 10, reference data 20 of the target battery OB or a battery of the same type as the target battery OB, and performing a change point estimation process of identifying the degradation change point CP where the degradation speed of the maximum battery capacity is changed as a result of increase of the usage degree of the target battery OB, based on the obtained plurality of parameters.

With the capacity degradation prediction method as described above, it is possible to obtain the degradation change point CP where the degradation speed of the maximum battery capacity of the target battery OB (secondary battery) becomes high. That is, the degradation change point CP of the secondary battery is affected by the plurality of parameters concerning capacity degradation, and by analyzing the plurality of parameters, it becomes possible to estimate the degradation change point CP accurately. Accordingly, in the capacity degradation prediction method, it is possible to recognize the effective utilization method of the target battery OB, the suitable replacement timing, etc.

Further, the above change point estimation process includes: a decrease curve generation process of, for each of the plurality of parameters, generating the decrease curve 30 represented by the change of the parameter and the decrease ratio of the maximum battery capacity; a usage degree curve generation process of, for each of the plurality of parameters, generating the usage degree curve 40 represented by the change of the parameter and the usage degree; and an identification process of identifying the degradation change point CP based on the decrease curve 30 and the usage degree curve 40 obtained for each of the plurality of parameters. With this configuration, in the capacity degradation prediction method, it is possible to accurately estimate the degradation change point CP based on the decrease curve 30 and the usage degree curve 40 obtained for each of the plurality of parameters.

Further, in the decrease curve generation process, by simulating a change of each of the plurality of parameters when the maximum battery capacity is decreased, the decrease curve 30 for each of the plurality of parameters is generated, and the change point 32*a*, 34*a*, 36*a*, 38*a* where the gradient of the decrease curve 30 changes is extracted from each of the plurality of the decrease curves 30. Using each of the decrease curves 30 and the change points 32*a*, 34*a*, 36*a*, 38*a* obtained as described above, in the capacity degradation prediction method, it is possible to easily recognize the factor of the degradation change point CP.

Further, in the simulating, a predetermined parameter among the plurality of parameters is selected, and in the state where parameters other than the predetermined parameter are fixed, the maximum battery capacity is decreased at a constant ratio, whereby a change of the predetermined parameter is derived to generate the decrease curve 30. With the above, in the degradation prediction method, it is possible to generate the characteristic of each of the parameters which affect degradation of the maximum battery capacity easily.

Further, in the identification process, the change point of each of the plurality of parameters is applied to the usage degree curve 40 of each of the plurality of parameters to thereby extract the usage degree at the change point 32*a*, 34*a*, 36*a*, 38*a* of each of the plurality of parameters, and a process of changing the decrease curve 30 of each of the plurality of parameters is repeated based on the extracted usage degree at the change point 32*a*, 34*a*, 36*a*, 38*a* of each of the plurality of parameters, to thereby set the change point 32*a*, 34*a*, 36*a*, 38*a* of one of the plurality of parameters to the degradation change point CP. With this, in the capacity degradation prediction method, it is possible to suitably obtain the degradation change point CP in consideration of the influence of each of the parameters in the target battery OB.

Further, in the usage degree curve generation process, the usage degree curve 40 of each of the plurality of parameters is generated based on the plurality of parameters obtained in the actual estimation process and the usage degree associated with the plurality of parameters, and the prediction curve 42*p*, 44*p*, 46*p*, 48*p* where each of the plurality of parameters change is calculated for each of the plurality of usage degree curves 40. With this, in the capacity degradation prediction method, it is possible to suitably obtain the usage degree curve 40 of each parameter.

Further, in the fitting operation, a characteristic curve obtained by differentiating the current capacity by the voltage is calculated for each of the target charge curve 10 and the reference data 20, and each of the characteristic curves is fitted. In this manner, in the capacity degradation prediction method, it is possible to accurately obtain the plurality of parameters for estimating the degradation change point CP.

Further, the plurality of parameters include a parameter concerning capacity decrease of a positive electrode, a parameter concerning capacity decrease of a negative electrode, and a parameter concerning decrease of lithium ions, and a parameter concerning resistance increase. Accordingly, it is possible to reliably obtain the degradation change point CP based on each of the parameters which are factors of capacity degradation of the target battery OB.

Further, according to a second aspect of the present invention, the prediction system 100 configured to perform the method of predicting capacity degradation of the secondary battery is provided. The prediction system 100 includes the charger 120 configured to charge the target battery OB which is a target of estimation of the capacity degradation, and the estimation apparatus 140, 140A connected to the charger 120. The estimation apparatus 140, 140A is configured to perform an actual estimation process of obtaining the target charge curve (target-battery charge curve) 10, based on charge current and charge voltage supplied to the target battery OB after degradation, the target charge curve being represented by the current capacity and the voltage, and obtaining changes of a plurality of parameters concerning capacity degradation, based on fitting operation of fitting, to the obtained target charge curve 10, reference data 20 of the target battery OB or a battery of the same type as the target battery OB, and perform the change point estimation process of identifying the degradation change point CP where the degradation speed of the maximum battery capacity is changed as a result of increase of the usage degree of the target battery OB, based on the obtained plurality of parameters. With the above configuration, the prediction system 100 can accurately estimate the degradation change point CP where the degradation speed of the maximum battery capacity of the secondary battery becomes high.

What is claimed is:

1. A capacity degradation prediction method of predicting capacity degradation of a secondary battery, comprising:
performing an actual estimation process of obtaining a target-battery charge curve, represented by a current capacity and a voltage, of a target battery as a target of estimation of capacity degradation, and obtaining changes of a plurality of parameters concerning capacity degradation, based on fitting operation of fitting, to the obtained target-battery charge curve, reference data of the target battery or a battery of a same type as the target battery; and performing a change point estimation process of identifying a degradation change point where a degradation speed of a maximum battery capacity is changed as a result of increase of a usage degree of the target battery, based on the obtained plurality of parameters, wherein the change point estimation process comprises:

a decrease curve generation process of, for each of the plurality of parameters, generating a decrease curve represented by the change of the parameter and a decrease ratio of the maximum battery capacity;

a usage degree curve generation process of, for each of the plurality of parameters, generating a usage degree curve represented by the change of the parameter and the usage degree; and an identification process of identifying the degradation change point based on the decrease curve and the usage degree curve obtained for each of the plurality of parameters.

2. The capacity degradation prediction method according to claim 1, wherein in the decrease curve generation process, by simulating change of each of the plurality of parameters when the maximum battery capacity is decreased, the decrease curve for each of the plurality of parameters is generated, and a change point where a gradient of the decrease curve changes is extracted from each of the plurality of the decrease curves.

3. The capacity degradation prediction method according to claim 2, wherein in the simulating, a predetermined parameter among the plurality of parameters is selected, and in a state where parameters other than the predetermined parameter are fixed, the maximum battery capacity is decreased at a constant ratio and change of the predetermined parameter is derived to generate the decrease curve.

4. The capacity degradation prediction method according to claim 2, wherein in the identification process, the change point of each of the plurality of parameters is applied to the usage degree curve of each of the plurality of parameters to thereby extract the usage degree at the change point of each of the plurality of parameters; and a process of changing the decrease curve of each of the plurality of parameters is repeated based on the extracted usage degree at the change point of each of the plurality of parameters, to thereby set the change point of one of the plurality of parameters to the degradation change point.

5. The capacity degradation prediction method according to claim 1, wherein in the usage degree curve generation process, the usage degree curve of each of the plurality of parameters is generated based on the plurality of parameters obtained in the actual estimation process and the usage degree associated with the plurality of parameters; and a prediction curve where each of the plurality of parameters changes is calculated for each of the plurality of usage degree curves.

6. The capacity degradation prediction method according to claim 1, wherein in the fitting operation, a characteristic curve obtained by differentiating the current capacity by the voltage is calculated for each of the target-battery charge curve and the reference data, and each of the characteristic curves is fitted.

7. The capacity degradation prediction method according to claim 1, wherein the plurality of parameters comprise a parameter concerning capacity decrease of a positive electrode, a parameter concerning capacity decrease of a negative electrode, a parameter concerning decrease of lithium ions, and a parameter concerning resistance increase.

8. A prediction system configured to perform a method of predicting capacity degradation of a secondary battery, the prediction system comprising:

a charger configured to charge a target battery which is a target of estimation of capacity degradation;

an estimation apparatus connected to the charger; and one or more processors that execute computer-executable instructions stored in a memory, wherein the one or more processors execute the computer-executable instructions to cause the estimation apparatus to:

perform an actual estimation process of obtaining a target-battery charge curve, based on charge current and charge voltage supplied to the target battery after degradation, the target-battery charge curve being represented by a current capacity and a voltage, and obtaining changes of a plurality of parameters concerning capacity degradation, based on fitting operation of fitting, to the obtained target-battery charge curve, reference data of the target battery or a battery of a same type as the target battery; and perform a change point estimation process of identifying a degradation change point where a degradation speed of a maximum battery capacity is changed as a result of increase of a usage degree of the target battery, based on the obtained plurality of parameters, wherein the change point estimation process comprises:

a decrease curve generation process of, for each of the plurality of parameters, generating a decrease curve represented by the change of the parameter and a decrease ratio of the maximum battery capacity;

a usage degree curve generation process of, for each of the plurality of parameters, generating a usage degree curve represented by the change of the parameter and the usage degree; and an identification process of identifying the degradation change point based on the decrease curve and the usage degree curve obtained for each of the plurality of parameters.

* * * * *